(12) United States Patent
Cha et al.

(10) Patent No.: US 12,453,214 B2
(45) Date of Patent: Oct. 21, 2025

(54) DISPLAY DEVICE

(71) Applicant: Samsung Display Co., LTD., Yongin-si (KR)

(72) Inventors: Jong Hwan Cha, Suwon-si (KR); Seung Jin Chu, Cheonan-si (KR); Je Min Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 404 days.

(21) Appl. No.: 18/026,448

(22) PCT Filed: Sep. 7, 2021

(86) PCT No.: PCT/KR2021/012088
§ 371 (c)(1),
(2) Date: Mar. 15, 2023

(87) PCT Pub. No.: WO2022/059986
PCT Pub. Date: Mar. 24, 2022

(65) Prior Publication Data
US 2023/0261143 A1  Aug. 17, 2023

(30) Foreign Application Priority Data
Sep. 16, 2020 (KR) .......... 10-2020-0118871

(51) Int. Cl.
*H10H 20/831* (2025.01)
*H01L 25/16* (2023.01)
(Continued)

(52) U.S. Cl.
CPC ......... *H10H 20/831* (2025.01); *H01L 25/167* (2013.01); *H10D 86/441* (2025.01); *H10D 86/60* (2025.01)

(58) Field of Classification Search
CPC ....... H01L 23/13; H01L 23/48; H01L 23/485; H01L 23/525; H01L 23/481;
(Continued)

(56) References Cited

U.S. PATENT DOCUMENTS

RE13,406 E    4/1912  Semple
1,125,686 A   1/1915  Hazelton et al.
(Continued)

FOREIGN PATENT DOCUMENTS

KR  10-2008-0058578  6/2008
KR  10-2017-0078394  7/2017
(Continued)

OTHER PUBLICATIONS

Kim et al, WO-2020017722-A1, Machine Translation (Year: 202).*
(Continued)

*Primary Examiner* — Andres Munoz
(74) *Attorney, Agent, or Firm* — Womble Bond Dickinson (US) LLP

(57) ABSTRACT

A display device includes: a first substrate; a first conductive layer including a first voltage line and a second voltage line on the first substrate; a first transistor on the first conductive layer and electrically connected to the first voltage line; a plurality of first banks on the first transistor and spaced apart from each other; a first electrode on the plurality of first banks and electrically connected to the first transistor, and a second electrode on the plurality of first banks and electrically connected to the second voltage line; a plurality of light-emitting diodes on the first electrode and the second electrode; and a first contact electrode coming into contact with an end portion of each of the light-emitting diodes and on the first electrode, and a second contact electrode coming into contact with another end portion of each of the light-emitting diodes and on the second electrode.

22 Claims, 25 Drawing Sheets

(51) Int. Cl.
*H10D 86/40* (2025.01)
*H10D 86/60* (2025.01)

(58) Field of Classification Search
CPC . H01L 25/0753; H01L 25/167; H10D 86/441; H10D 86/60; H10D 86/40; H10H 20/831; H10H 20/857; H10H 20/819
See application file for complete search history.

(56) References Cited

U.S. PATENT DOCUMENTS

| | | | |
|---|---|---|---|
| 2,251,257 | A | 7/1941 | Lanphere et al. |
| 2,898,455 | A | 8/1959 | Hymas et al. |
| 3,921,498 | A | 11/1975 | Kongelbeck |
| 2015/0187859 | A1* | 7/2015 | Choi ............... G09G 3/3225 257/72 |
| 2018/0019369 | A1* | 1/2018 | Cho ................. H05K 1/181 |
| 2019/0326348 | A1* | 10/2019 | Im ................... G09G 3/32 |
| 2020/0075667 | A1* | 3/2020 | Lee .................. H10H 20/83 |
| 2021/0288033 | A1* | 9/2021 | Lim .................. H10H 20/821 |

FOREIGN PATENT DOCUMENTS

| | | |
|---|---|---|
| KR | 10-2019-0121894 | 10/2019 |
| KR | 10-2020-0006208 | 1/2020 |
| KR | 10-2020-0009175 | 1/2020 |
| KR | 10-2020-0010704 | 1/2020 |
| KR | 10-2136584 | 8/2020 |
| WO | WO-2020017722 A1 * | 1/2020 ........... H10H 20/857 |

OTHER PUBLICATIONS

International Search Report, with English translation, corresponding to International Application No. PCT/KR2021/012088 dated Dec. 23, 2021.

\* cited by examiner

DISPLAY DEVICE

CROSS REFERENCE TO RELATED APPLICATION(S)

This application is a national entry of International Application No. PCT/KR2021/012088, filed on Sep. 7, 2021, which claims under 35 U.S.C. §§ 119(a) and 365(b) priority to and benefits of Korean Patent Application No. 10-2020-0118871, filed on Sep. 16, 2020, in the Korean Intellectual Property Office (KIPO), the entire content of which are incorporated herein by reference.

TECHNICAL FIELD

Embodiments relate to a display device.

DESCRIPTION OF RELATED ART

The importance of display devices has steadily increased with the development of multimedia technology. Various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) including an organic material as a fluorescent material and an inorganic light emitting diode including an inorganic material as a fluorescent material.

SUMMARY

Embodiments provide a display device in which the number of processes is decreased by forming voltage lines as lower conductive layers.

However, embodiments are not limited to those set forth herein. The above and other embodiments will become more apparent to one of ordinary skill in the art to which the disclosure pertains by referencing the detailed description of the disclosure given below.

According to an embodiment, a display device may include: a first substrate, a first conductive layer including a first voltage line and a second voltage line disposed on the first substrate, a first transistor disposed on the first conductive layer and electrically connected to the first voltage line, a plurality of first banks disposed on the first transistor and spaced apart from each other, a first electrode disposed on the plurality of first banks and electrically connected to the first transistor and a second electrode disposed on the plurality of first banks and electrically connected to the second voltage line, a plurality of light emitting elements disposed on the first electrode and the second electrode, and a first contact electrode being in contact with end portions of the plurality of light emitting elements and disposed on the first electrode and a second contact electrode being in contact with the other end portions of the plurality of light emitting elements and disposed on the second electrode.

The first electrode and the second electrode may be disposed on the plurality of first banks different from each other, respectively, and are disposed to be spaced apart from each other, and the plurality of light emitting elements may be disposed between the plurality of first banks spaced apart from each other.

The plurality of light emitting elements may be disposed on the first electrode and the second electrode.

The display device may further include a first insulating layer disposed on the first electrode and the second electrode, wherein the plurality of light emitting elements may be disposed on the first insulating layer.

The first contact electrode may be in contact with the first electrode through an opening passing through the first insulating layer and exposing a portion of an upper surface of the first electrode, and the second contact electrode may be in contact with the second electrode through another opening passing through the first insulating layer and exposing a portion of an upper surface of the second electrode.

The display device may further include an insulating layer exposing the end portions and the other end portions of the plurality of light emitting elements and disposed on the plurality of light emitting elements, and wherein a side of each of the first contact electrode and the second contact electrode may be disposed on the insulating layer.

The display device may further include a buffer layer disposed on the first conductive layer, a semiconductor layer disposed on the buffer layer and including a first active layer of the first transistor, a first gate insulating layer disposed on the semiconductor layer, a second conductive layer disposed on the first gate insulating layer and including a first gate electrode of the first transistor, a first interlayer insulating layer disposed on the second conductive layer, and a third conductive layer disposed on the first interlayer insulating layer and including a source electrode and a drain electrode of the first transistor.

The display device may further include a third voltage line including a first line pattern layer and a second line pattern layer being in contact with the first line pattern layer, and a fourth voltage line, wherein the first line pattern layer and the first conductive layer may be disposed at a same level, the second line pattern layer and the third conductive layer may be disposed at a same level, and the fourth voltage line and the third conductive layer may be disposed at a same level.

The second line pattern layer may be in contact with the first line pattern layer through a first contact hole passing through the buffer layer, the first gate insulating layer, and the first interlayer insulating layer, and the fourth voltage line may be in contact with the second voltage line through a second contact hole passing through the buffer layer, the first gate insulating layer, and the first interlayer insulating layer.

The second electrode may be in contact with the fourth voltage line.

The display device may further include a first conductive pattern layer, wherein the first conductive pattern layer and the third conductive layer are disposed at a same level, and the first conductive pattern may be in contact with each of the first line pattern layer and the first voltage line through contact holes passing through the buffer layer, the first gate insulating layer, and the first interlayer insulating layer.

The first line pattern layer may overlap the plurality of light emitting elements in a thickness direction.

The plurality of first banks may be disposed on the first interlayer insulating layer.

At least portions of the first electrode and the second electrode may be disposed on the first interlayer insulating layer.

The display device may further include a second interlayer insulating layer disposed between the third conductive layer and the plurality of first banks, wherein the second interlayer insulating layer may include silicon nitride ($SiN_x$).

According to an embodiment, a display device may include: a first voltage line and a second voltage line extending in a first direction and spaced apart from each other in a second direction intersecting the first direction, a third voltage line and a fourth voltage line extending in the second direction, spaced apart from each other in the first direction, and crossing the first voltage line and the second voltage line, respectively, a first electrode extending in the second direction and partially overlapping the third voltage line and a second electrode extending in the second direction, partially overlapping the fourth voltage line, and spaced apart from the first electrode in the first direction, a plurality of light emitting elements disposed on the first electrode and the second electrode and spaced apart from each other in the second direction, and a first contact electrode extending in the second direction, disposed on the first electrode, and being in contact with end portions of the plurality of light emitting elements and a second contact electrode extending in the second direction, disposed on the second electrode, and being in contact with other end portions of the plurality of light emitting elements, wherein the first contact electrode is electrically connected to the first voltage line, and the second contact electrode is electrically connected to the second voltage line.

The first voltage line and the second voltage line may be formed as a conductive layer disposed at a different level from the fourth voltage line.

The third voltage line may include a first line pattern layer extending in the second direction between the first voltage line and the second voltage line and a second line pattern layer extending in the second direction, partially overlapping the first line pattern layer, and crossing the first voltage line and the second voltage line, and the first line pattern layer and the second line pattern layer may be connected to each other.

The fourth voltage line may be in contact with the second voltage line at a portion crossing the second voltage line.

The display device may further include a first scan line and a second scan line disposed between the first voltage line and the second voltage line and extending in the first direction, respectively, and a data line and a fifth voltage line spaced apart from the third voltage line in the first direction and extending in the second direction.

The first electrode may include an extension part and an expansion part, the extension part may extend in the second direction, the expansion part may be connected to the extension part and may have a greater width than the extension part, and the plurality of light emitting elements may be disposed on the expansion part.

The first electrode may include a first extension part, a second extension part, and a connection part, the first extension part and the second extension part may extend in the second direction and may be spaced apart from each other in the first direction, the connection part may connect the first extension part and the second extension part to each other and may extend in the first direction, and the plurality of light emitting elements may be disposed on the second extension part and the second electrode.

In a display device according to an embodiment, voltage lines applying source voltages to light emitting elements may be separately disposed at different levels by forming of different conductive layers, respectively. In the display device, the voltage lines and the other lines may be disposed at the same level and may be formed of the same conductive layer, such that a separate conductive layer for the voltage lines may be omitted, and the number of manufacturing processes of the display device may be decreased.

The effects according to the embodiments are not limited by the contents above, and more various effects are included in this disclosure.

DETAILED DESCRIPTION OF THE EMBODIMENTS

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that in case that a layer is referred to as being "on" another layer or substrate, it can be directly on the other layer or substrate, or intervening layers may also be present. The same reference numbers indicate the same components throughout the specification.

It with be understood that, although the terms "first," "second," etc. may be used herein to describe various elements, these elements should not be limited by these terms. These terms are only used to distinguish an element from another element. For instance, a first element discussed below could be termed a second element without departing from the teachings of the invention. Similarly, the second element could also be termed the first element.

Hereinafter, embodiments will be described with reference to the accompanying drawings.

Figure 1:
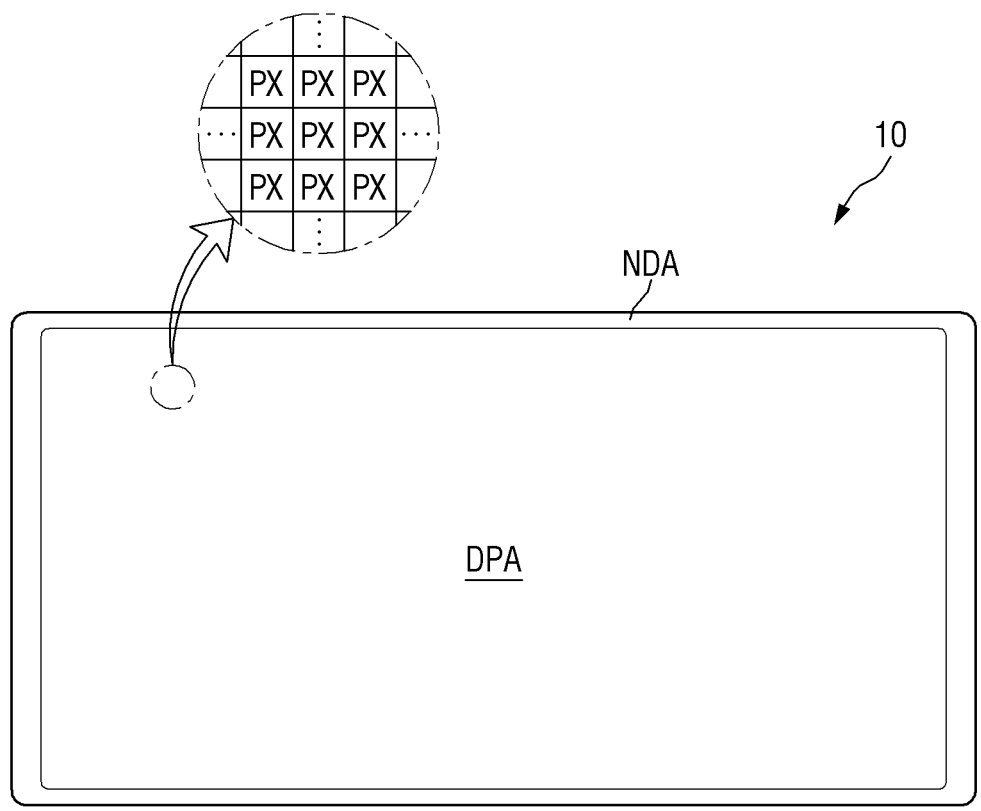
FIG. 1 is a schematic plan view of a display device according to an embodiment.
Figure 1:
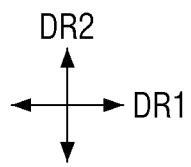

FIG. 1 is a schematic plan view of a display device according to an embodiment.

The terms "above", "top", and "upper surface" as used herein refer to an upward direction (e.g., a direction of a third direction DR3) with respect to a display device 10. The terms "under", "bottom", and "lower surface" as used herein refer to another direction of the third direction DR3. For example, "left", "right", "upper", and "lower" refer to directions in case that the display device 10 is viewed from above. For example, "left" refers to a direction of a first direction DR1, "right" refers to another direction of the first direction DR1, "upper" refers to a direction of a second direction DR2, and "lower" refers to another direction of the second direction DR2.

Referring to FIG. 1, a display device 10 may display a moving image or a still image. The display device 10 may refer to all electronic devices that include display screens. For example, televisions, laptop computers, monitors, billboards, the Internet of Things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and the like, which include display screens, may be included in the display device 10.

The display device 10 may include a display panel including the display screen. The display panel may include an inorganic light emitting diode display panel, an organic light emitting display panel, a quantum dot light emitting display panel, a plasma display panel, a field emission display panel, and the like. Hereinafter, a case where an inorganic light emitting diode display panel is applied as an example of the display panel will be described, but embodiments are not limited thereto, and various display panels may be applicable thereto.

A shape of the display device 10 may be variously modified. For example, the display device 10 may have a shape such as a rectangular shape with a width greater than a length, a rectangular shape with a length greater than a width, a square shape, a rectangular shape with rounded corners (e.g., vertices), other polygonal shapes, or a circular shape. A shape of a display area DPA of the display device 10 may also be similar to an overall shape of the display device 10. In FIG. 1, the display device 10 and the display area DPA having the rectangular shape with the width greater than the length are illustrated.

The display device 10 may include a display area DPA and non-display areas NDA. The display area DPA may be an area in which a screen is displayed, and the non-display area NDA may be an area in which the screen is not displayed. The display area DPA may also be referred to as an active area, and the non-display area NDA may also be referred to as a non-active area. The display area DPA may occupy substantially the center portion of the display device 10.

The display area DPA may include pixels PX. The pixels PX may be arranged in a matrix direction. A shape of each pixel PX may be a rectangular shape or a square shape in plan view, but embodiments are not limited thereto, and may also be a rhombic shape of which each side is inclined with respect to a direction. The respective pixels PX may be alternately arranged in a stripe type or a PenTile® type. For example, each of the pixels PX may include one or more light emitting elements ED emitting light of a specific wavelength band to display a specific color.

The non-display areas NDA may be disposed around the display area DPA. The non-display areas NDA may entirely or partially surround the display area DPA. The display area DPA may have a rectangular shape, and the non-display areas NDA may be disposed adjacent to four sides of the display area DPA. The non-display areas NDA may form a bezel of the display device 10. Lines or circuit drivers included in the display device 10 may be disposed, or external devices may be mounted in each of the non-display areas NDA.

Figure 2:
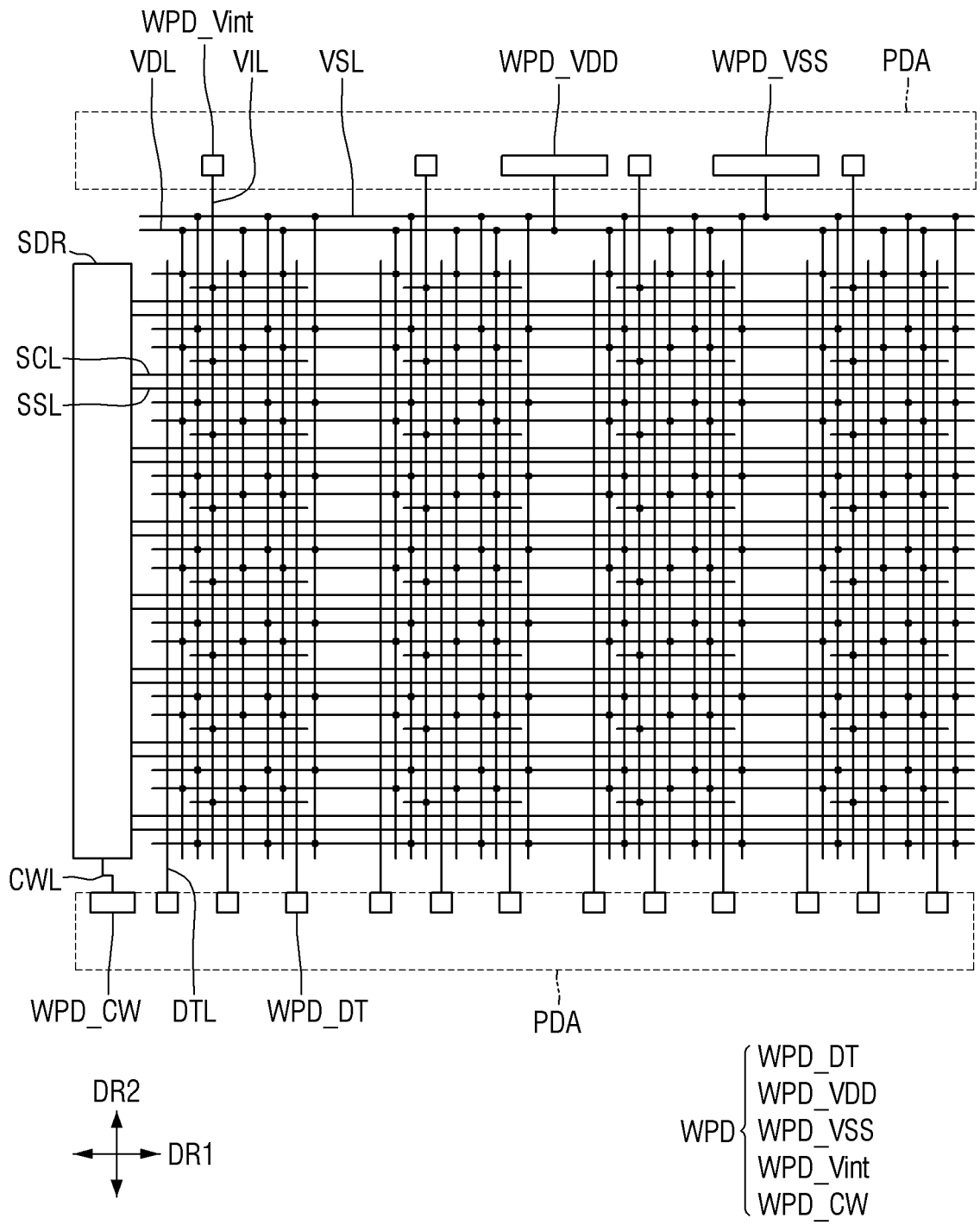
FIG. 2 is a schematic layout diagram illustrating lines included in the display device according to an embodiment.

FIG. 2 is a schematic layout diagram illustrating lines included in the display device according to an embodiment.

Referring to FIG. 2, the display device 10 may include lines. The lines may include first scan lines SCL, second scan lines SSL, data lines DTL, fifth voltage lines VIL, first voltage lines VDL, second voltage lines VSL, and the like. For example, other lines may be further disposed in the display device 10.

The first scan lines SCL and the second scan lines SSL may extend in the first direction DR1. The first scan lines SCL and the second scan lines SSL may be connected (e.g., electrically connected) to a scan driver SDR. The scan driver SDR may include a driving circuit. The scan driver SDR may be disposed on a side of the display area DPA in the first direction DR1, but embodiments are not limited thereto. The scan driver SDR may be connected (e.g., electrically connected) to a signal line pattern layer CWL, and at least one end portion of the signal line pattern layer CWL may be connected (e.g., electrically connected) to an external device by forming a pad WPD_CW on the non-display area NDA.

The term 'connection' as used herein may not only mean that any one member is connected to another member through physical contact with another member, but may also mean that any one member is connected to another member through the other member. For example, it may be understood that any one portion and another portion as one integrated member are interconnected due to the integrated member. Furthermore, a connection between any one member and another member may be interpreted as the meaning including an electrical connection through the other member in addition to a connection through direct contact therebetween.

The data lines DTL and the fifth voltage lines VIL may extend in the second direction DR2 crossing the first direction DR1. The fifth voltage lines VIL may further include not only portions extending in the second direction DR2 but also portions branched from these portions in the first direction DR1.

The first voltage lines VDL and the second voltage lines VSL may extend in the first direction DR1 and the second direction DR2. As described below, portions of the first voltage lines VDL and the second voltage lines VSL extending in the first direction DR1 and portions of the first voltage lines VDL and the second voltage lines VSL extending in the second direction DR2 may be formed as conductive layers disposed at different levels (or at different layers), and the first voltage lines VDL and the second voltage lines VSL may have a mesh structure in the entirety of the display area DPA. However, embodiments are not limited thereto. Each of pixels PX of the display device 10 may be connected (e.g., electrically connected) to at least one data line DTL, fifth voltage line VIL, first voltage line VDL, and second voltage line VSL.

The data line DTL, the fifth voltage line VIL, the first voltage line VDL, and the second voltage line VSL may be electrically connected to at least one wiring pad WPD. Each wiring pad WPD may be disposed in the non-display area NDA. In an embodiment, wiring pads WPD_DT (hereinafter, referred to as 'data pads') of the data lines DTL may be disposed on a pad area PDA positioned on a side of the display area DPA in the second direction DR2, and wiring pads WPD_Vint (hereinafter, referred to as 'initialization voltage pads') of the fifth voltage lines VIL, wiring pads WPD_VDD (hereinafter, referred to as 'first power pads') of the first voltage lines VDL, and wiring pads WPD_VSS (hereinafter, referred to as 'second power pads') of the second voltage lines VSL may be disposed in a pad area PDA positioned on another side of the display area DPA in the second direction DR2. As another example, all of the data pads WPD_DT, the initialization voltage pads WPD_Vint, the first power pad WPD_VDD, and the second power pad WPD_VSS may be disposed in the same area, for example, a non-display area NDA positioned on the upper side of the display area DPA. An external device may be mounted on the wiring pad WPD. The external device may be mounted on the wiring pad WPD through an anisotropic conductive film, ultrasonic bonding, or the like.

Each pixel PX or sub-pixel PXn of the display device 1 may include a pixel driving circuit, where n is an integer of 1 to 3. The above-described lines may apply driving signals to the respective pixel driving circuits and may pass through the respective pixels PX or around the respective pixels PX. The pixel driving circuit may include a transistor and a capacitor. The numbers of transistors and capacitors in each pixel driving circuit may be variously modified. According to an embodiment, each sub-pixel PXn of the display device 10 may have a 3T-1C structure in which the pixel driving circuit includes three transistors and one capacitor. Hereinafter, the pixel driving circuit will be described using the 3T-1C structure as an example, but embodiments are not limited thereto, and various other modified pixel PX structures such as a 2T-1C structure, a 7T-1C structure, and a 6T-1C structure may also be applied.

Figure 3:
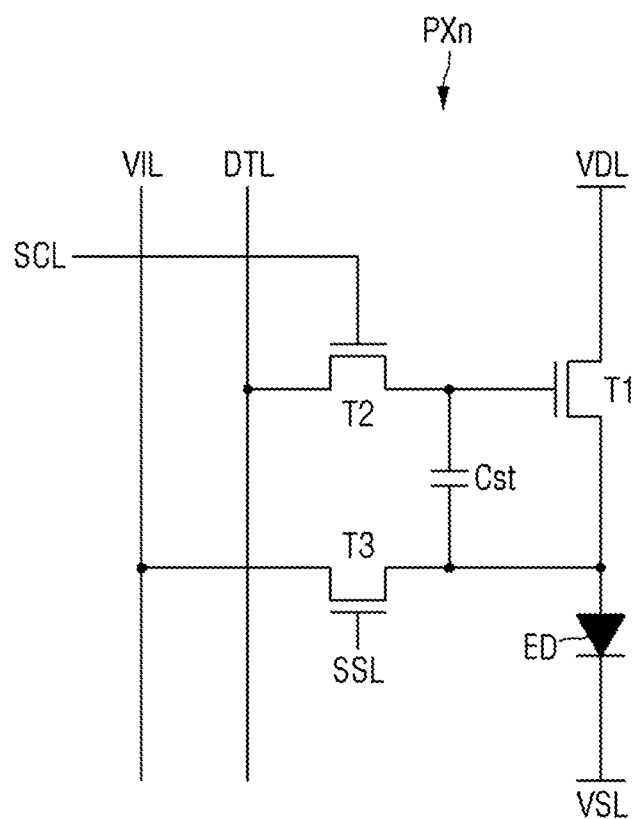
FIG. 3 is a schematic diagram of an equivalent circuit of a sub-pixel according to an embodiment.

FIG. 3 is a schematic diagram of an equivalent circuit of a sub-pixel according to an embodiment.

Referring to FIG. 3, each sub-pixel PXn of the display device 10 according to an embodiment may include three transistors T1, T2, and T3 and one storage capacitor Cst in addition to a light emitting element ED.

The light emitting element ED may emit light according to a current supplied through a first transistor T1. The light emitting element ED may be connected (e.g., electrically connected) to the first transistor T1 and a second voltage line VSL through a first electrode, a second electrode, and contact electrodes to be described below. The light emitting element ED may emit light of a specific wavelength band by a transferred electrical signal.

An electrode of the light emitting element ED may be connected (e.g., electrically connected) to a source electrode of the first transistor T1, and another electrode of the light emitting element ED may be connected (e.g., electrically connected) to the second voltage line VSL to which a low potential voltage (hereinafter, referred to as a second source voltage) lower than a high potential voltage (hereinafter, referred to as a first source voltage) of a first voltage line VDL is supplied. For example, another electrode of the light emitting element ED may be connected (e.g., electrically connected) to a source electrode of a second transistor T2.

The first transistor T1 adjusts a current flowing from the first voltage line VDL to which the first source voltage is supplied to the light emitting element ED according to a voltage difference between a gate electrode and the source electrode thereof. As an example, the first transistor T1 may be a driving transistor for driving the light emitting element ED. The gate electrode of the first transistor T1 may be connected (e.g., electrically connected) to the source electrode of a second transistor T2, the source electrode of the first transistor T1 may be connected (e.g., electrically connected) to a first electrode of the light emitting element ED, and a drain electrode of the first transistor T1 may be connected (e.g., electrically connected) to the first voltage line VDL to which the first source voltage is applied.

The second transistor T2 may be turned on by a first scan signal of a first scan line SCL to connect a data line DTL to the gate electrode of the first transistor T1. A gate electrode of the second transistor T2 may be connected (e.g., electrically connected) to the first scan line SCL, the source electrode of the second transistor T2 may be connected (e.g., electrically connected) to the gate electrode of the first transistor T1, and a drain electrode of the second transistor T2 may be connected (e.g., electrically connected) to the data line DTL.

A third transistor T3 may be turned on by a second scan signal of a second scan line SSL to connect the fifth voltage line VIL to an electrode of the light emitting element ED. A gate electrode of the third transistor T3 may be connected (e.g., electrically connected) to the second scan line SSL, a drain electrode of the third transistor T3 may be connected (e.g., electrically connected) to the fifth voltage line VIL, and a source electrode of the third transistor T3 may be connected (e.g., electrically connected) to an electrode of the light emitting element ED or the source electrode of the first transistor T1.

In an embodiment, the source electrode and the drain electrode of each of the transistors T1, T2, and T3 are not limited to those described above, and vice versa. For example, each of the transistors T1, T2, and T3 may be formed as a thin film transistor. For example, it has been described in FIG. 3 that each of the transistors T1, T2, and T3 is formed as an N-type metal oxide semiconductor field effect transistor (MOSFET), but embodiments are not limited thereto. For example, the respective transistors T1, T2, and T3 may be formed as P-type MOSFETs or some of the transistors T1, T2, and T3 may be formed as N-type MOSFETs and the others of the transistors T1, T2, and T3 may be formed as P-type MOSFETs.

The storage capacitor Cst may be formed between the gate electrode and the source electrode of the first transistor T1. The storage capacitor Cst may store a difference voltage between a gate voltage and a source voltage of the first transistor T1.

Hereinafter, a structure of a pixel PX of the display device 10 according to an embodiment will be described in detail with reference to other drawings.

Figure 4:
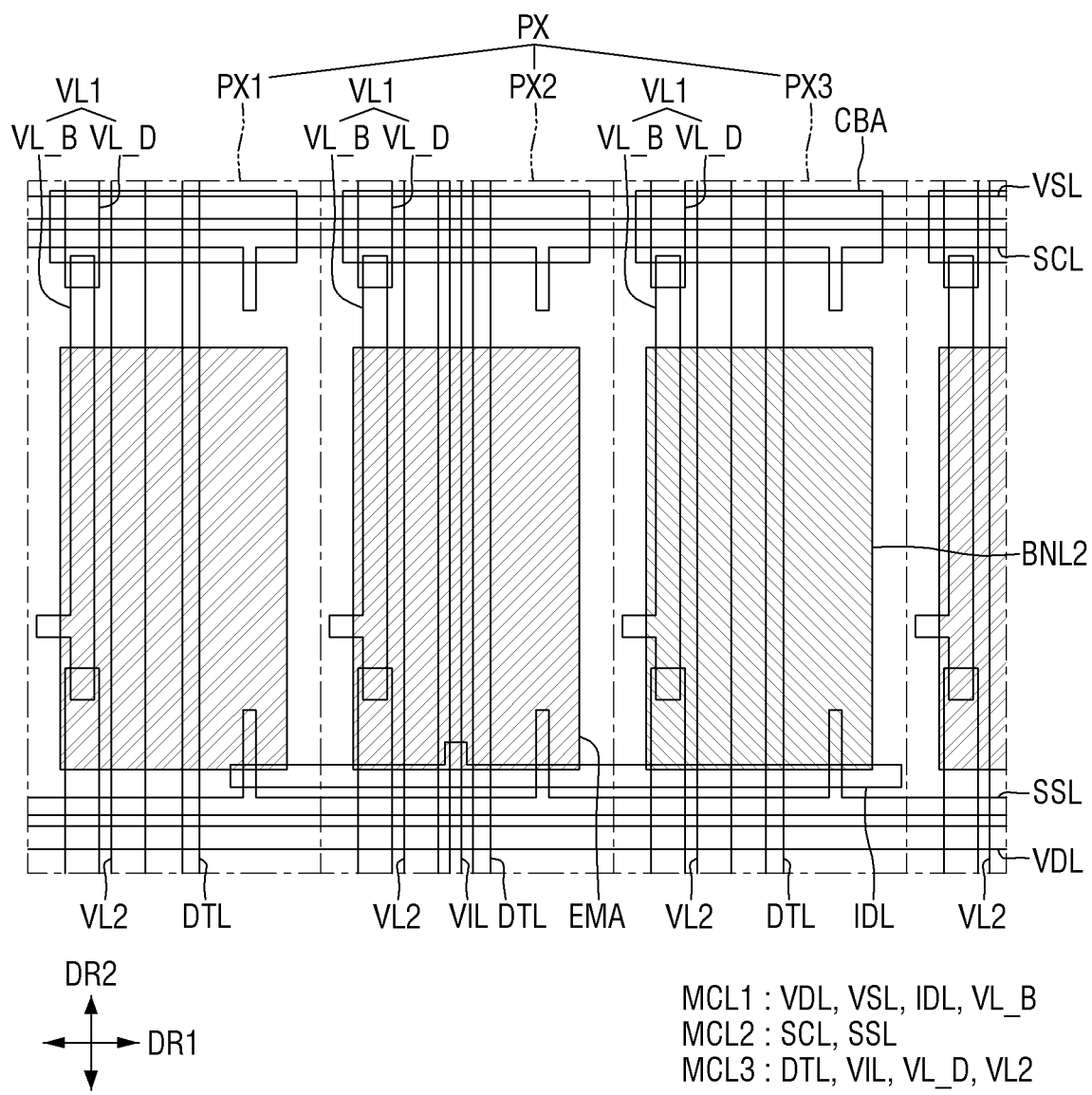
FIG. 4 is a schematic plan view illustrating lines disposed in a pixel of the display device according to an embodiment.

FIG. 4 is a schematic plan view illustrating lines disposed in a pixel of the display device according to an embodiment. In FIG. 4, schematic shapes of lines and a second bank BNL2 disposed in each pixel PX of the display device 10 are illustrated, and members disposed in an emission area EMA of each sub-pixel PXn and some conductive layers disposed below these members are omitted. In the following drawings, sides (e.g., opposite sides) in the first direction DR1 may be referred to as a left side and a right side, respectively, and sides (e.g., opposite sides) in the second direction DR2 may be referred to as an upper side and a lower side, respectively.

Referring to FIG. 4, each of the pixels PX of the display device 10 may include sub-pixels PXn, where n is an integer of 1 to 3. For example, a pixel PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red. However, embodiments are not limited thereto, and the respective sub-pixels PXn may also emit light of the same color.

Each of the sub-pixels PXn of the display device 10 may include an emission area EMA and a non-emission area. The emission area EMA may be an area in which light emitting elements ED (see FIG. 13) are disposed to emit light of a specific wavelength band, and the non-emission area may be an area in which the light emitting elements ED are not disposed and the light emitted from the light emitting elements ED does not arrive, and thus, the light is not emitted. The emission area may include an area in which the light emitting elements ED are disposed and include an area which is adjacent to the light emitting elements ED and in which the light emitted from the light emitting elements ED is emitted.

Embodiments are not limited thereto, and the emission area EMA may also include an area in which the light emitted from the light emitting elements ED is reflected or refracted by other members and emitted. Light emitting elements ED may be disposed in each sub-pixel PXn, and an emission area including an area in which the light emitting elements ED are disposed and an area adjacent to the light emitting elements ED may be formed.

For example, each sub-pixel PXn (e.g., PX1, PX2, PX2) may include a sub-area CBA disposed in the non-emission area. The sub-area CBA may be disposed on a side of the emission area EMA in the second direction DR2 and may be disposed between emission areas EMA of sub-pixels PXn adjacent to each other in the second direction DR2. Emission areas EMA and sub-areas CBA may be arranged in the display area DPA of the display device 10. For example, the emission areas EMA and sub-areas CBA may be repeatedly arranged in the first direction DR1, respectively, and the emission areas EMA and the sub-areas CBA may be alternately arranged in the second direction DR2. For example, an interval between the sub-areas CBA spaced apart from each other in the first direction DR1 may be smaller than an interval (or distance) between the emission areas EMA spaced apart from each other in the first direction DR1. The second bank BNL2 may be disposed between the sub-areas CBA and the emission areas EMA, and intervals (or distances) between the sub-areas CBA and the emission areas EMA may change according to a width of the second bank BNL2. Light may not be emitted from the sub-areas CBA as the light emitting elements ED are not disposed in the sub-areas CBA, but portions of electrodes RME1 and RME2 (see FIG. 7) disposed in each sub-pixel PXn may be disposed in the sub-areas CBA. The electrodes RME1 and RME2 disposed in each sub-pixel PXn may be separated from each other in the sub-area CBA.

The second bank BNL2 may be disposed in a lattice-shaped pattern in the entirety of the display area DPA by including portions extending in the first direction DR1 and the second direction DR2 in plan view. The second bank BNL2 may be disposed across a boundary area between the respective sub-pixels PXn to divide neighboring sub-pixels PXn. For example, the second bank BNL2 may surround the emission area EMA and the sub-area CBA disposed in each sub-pixel PXn to divide the emission area EMA and the sub-area CBA. A portion disposed between the emission areas EMA in a portion of the second pattern layer BNL2 extending in the second direction DR2 may have a greater width than a portion disposed between the sub-areas CBA. Accordingly, an interval (or distance) between the sub-areas CBA may be smaller than an interval (or distance) between the emission areas EMA. A more detailed description of the second bank BNL2 will be provided below.

Lines may be disposed in each pixel PX and sub-pixel PXn of the display device 10. For example, the display device 10 may include voltage distribution lines IDL, first voltage lines VDL, and second voltage lines VSL disposed across several sub-pixels PXn, in addition to first scan lines SCL and second scan lines SSL that are disposed to extend in the first direction DR1. For example, the display device 10 may include data lines DTL, fifth voltage lines VIL, third voltage lines VL1, and fourth voltage lines VL2 disposed to extend in the second direction DR2.

The first voltage line VDL and the second voltage line VSL may extend in the first direction DR1 and may be disposed across sub-pixels PXn adjacent to each other in the first direction DR1. First voltage lines VDL and second voltage lines VSL may be spaced apart from each other in the second direction DR2 in the display area DPA, and the respective first voltage lines VDL and second voltage lines VSL may be disposed across sub-pixels PXn arranged in the same row. Based on each pixel PX or sub-pixel PXn, the first voltage line VDL may be disposed on the lower side of the emission area EMA in plan view, and the second voltage line VSL may be disposed on the upper side of the emission area EMA in plan view. The first voltage line VDL and the second voltage line VSL connected to different sub-pixels PXn may be disposed adjacent to each other at a boundary area with another pixel PX or sub-pixel PXn adjacent in the second direction DR2.

The first voltage line VDL may be electrically connected to the drain electrode of the first transistor T1, and may apply the first source voltage to the first transistor T1. The second voltage line VSL may be electrically connected to a second electrode RME2 to be described below to apply the second source voltage to the light emitting elements ED.

The voltage distribution line IDL may be disposed for each pixel PX and be disposed across three sub-pixels PXn. The voltage distribution line IDL may be disposed on the upper side of the first voltage line VDL and have a shape in which it extends in the first direction DR1, in plan view. The voltage distribution line IDL may be electrically connected to the fifth voltage line VIL to transfer an initialization voltage applied to each pixel PX to the respective sub-pixels PXn. As an example, the voltage distribution line IDL may be in direct contact with the fifth voltage line VIL through a contact hole (e.g., CT10 of FIG. 6), and may be electrically connected to drain electrodes of third transistors T3 of the respective sub-pixels PXn. The voltage distribution line IDL may be disposed across sub-pixels PXn in a pixel PX, and thus, may simultaneously apply the initialization voltage applied from the fifth voltage line VIL to the third transistors T3 of the respective sub-pixels PXn.

The first voltage line VDL, the second voltage line VSL, and the voltage distribution line IDL may be formed as a first conductive layer MCL1. The first conductive layer MCL1 may further include another conductive layer in addition to such lines.

The first scan line SCL may extend in the first direction DR1 and may be disposed across sub-pixels PXn arranged in the first direction DR1. First scan lines SCL may be spaced apart from each other in the second direction DR2 in the display area DPA, and the respective first scan lines SCL may be disposed across sub-pixels PXn arranged in the same row. The first scan line SCL may be disposed on the upper side of the center portion of each pixel PX or sub-pixel PXn or the lower side of the second voltage line VSL in plan view. For example, the first scan line SCL may include a portion protruding downward toward the emission area EMA of each sub-pixel PXn. The protruding portion of the first scan line SCL may function as the gate electrode of the second transistor T2, and may apply the first scan signal to the second transistor T2. In another example, the first scan line SCL may be connected (e.g., electrically connected) to the gate electrode of the second transistor T2 through an electrode disposed at another conductive layer.

For example, the second scan line SSL may extend in the first direction DR1 and may be disposed across the sub-pixels PXn arranged in the first direction DR1. Second scan lines SSL may be spaced apart from each other in the second direction DR2 in the display area DPA, and the respective second scan lines SSL may be disposed across the sub-pixels PXn arranged in the same row. The second scan line SSL may be disposed on the lower side of the center portion of each pixel PX or sub-pixel PXn or the upper side of the first voltage line VDL in plan view. For example, the second scan line SSL may include a portion protruding upward toward the emission area EMA of each sub-pixel PXn. The protruding portion of the second scan line SSL may function as the gate electrode of the third transistor T3, and may apply the second scan signal to the third transistor T3. In another example, the second scan line SSL may be connected (e.g., electrically connected) to the gate electrode of the third transistor T3 through an electrode disposed at another conductive layer.

The first scan line SCL and the second scan line SSL may be formed as a second conductive layer MCL2 disposed on the first conductive layer MCL1. The second conductive layer MCL2 may further include other lines or pattern layers in addition to such lines.

The data line DTL may extend in the second direction DR2 and may be disposed across sub-pixels PXn arranged in the second direction DR2. Data lines DTL may be spaced apart from each other in the first direction DR1 in the display area DPA, and the respective data lines DTL may be disposed across sub-pixels PXn arranged in the same column. The data line DTL may be disposed adjacent to a central portion of each sub-pixel PXn in plan view. However, the data line DTL may be positioned at the central portion of each sub-pixel PXn based on the emission area EMA surrounded by the second bank BNL2, but the data line DTL connected to the corresponding sub-pixel PXn may be disposed in an emission area EMA of another sub-pixel PXn adjacent to the corresponding sub-pixel PXn in the first direction DR1. For example, the data line DTL crossing an emission area EMA of any one sub-pixel PXn in the second direction DR2 in FIG. 4 may be a data line DTL that is not connected to the corresponding sub-pixel PXn and is connected to another sub-pixel PXn adjacent to the corresponding sub-pixel PXn in the first direction DR1. However, embodiments are not limited thereto. The data line DTL may be electrically connected to the drain electrode of the second transistor T2, and may apply a data signal to the second transistor T2.

The fifth voltage line VIL may extend in the second direction DR2 and may be disposed across pixels PX arranged in the second direction DR2. Fifth voltage lines VIL may be spaced apart from each other in the first direction DR1 in the display area DPA, and the respective fifth voltage lines VIL may be disposed across the sub-pixels PXn arranged in the same column. The fifth voltage line VIL may be disposed on the left side of the data line DTL in plan view. However, a single fifth voltage line VIL may be disposed per three sub-pixels PXn arranged in the first direction DR1 or per a single pixel PX, and the fifth voltage line VIL may be connected (e.g., electrically connected) to the voltage distribution line IDL to transfer the initialization voltage to the respective sub-pixels PXn. The fifth voltage line VIL may be electrically connected to the drain electrode of the third transistor T3, and may apply the initialization voltage to the third transistor T3. The third transistor T3 of each sub-pixel PXn may transfer the initialization voltage applied from the voltage line VIL to the source electrode of the first transistor T1 in order to initialize the source electrode of the first transistor T1.

For example, a sensing signal for external compensation for the first transistor T1 and the light emitting element ED may be applied to the fifth voltage line VIL. The fifth voltage line VIL may sense a voltage of the source electrode of the first transistor T1 in order to calculate a threshold voltage and electron mobility of the first transistor T1, and transfer the sensed voltage to an external compensation circuit. For example, the fifth voltage line VIL may sense the voltage of the source electrode of the first transistor T1 applied to the first electrode of the light emitting element ED in order to calculate a degree of deterioration of the light emitting element ED, and transfer the sensed voltage to the external compensation circuit.

The third voltage line VL1 and the fourth voltage line VL2 may extend in the second direction DR2 and may be disposed across sub-pixels PXn adjacent to each other in the second direction DR2. Third voltage lines VL1 and fourth voltage lines VL2 may be spaced apart from each other in the first direction DR1 in the display area DPA, and the respective third voltage lines VL1 and fourth voltage lines VL2 may be disposed across the sub-pixels PXn arranged in the same column.

The third voltage line VL1 may include a first line pattern layer VL_B and a second line pattern layer VL_D formed as conductive layers disposed at different levels. The first line pattern layer VL_B and the first voltage line VDL may be formed as the first conductive layer MCL1. The second line pattern layer VL_D and the data line DTL may be formed as a third conductive layer MCL3. The first line pattern layer VL_B and the second line pattern layer VL_D may extend in the second direction DR2, respectively, and may overlap each other in the emission area EMA. The first line pattern layer VL_B may be disposed across the emission area EMA and the non-emission area of the sub-pixel PXn, and the second line pattern layer VL_D may be disposed across a boundary area between sub-pixels PXn adjacent to each other in the second direction DR2 in addition to the emission area EMA and the non-emission area. The second line pattern layer VL_D may cross the first voltage line VDL and the second voltage line VSL. In FIG. 4, portions of the second line pattern layer VL_D are illustrated, and a portion disposed on the upper side and a portion disposed on the lower side in FIG. 4 may be second line pattern layers VL_D disposed across different sub-pixels PXn, respectively.

The fourth voltage line VL2 and the data line DTL may be formed as the third conductive layer MCL3. The fourth voltage line VL2 may extend in the second direction DR2. The third voltage line VL1 may be disposed on the left side of the data line DTL, and the fourth voltage line VL2 may be disposed between the third voltage line VL1 and the data line DTL or the fifth voltage line VIL. The third voltage line VL1 and the fourth voltage line VL2 may extend in the second direction DR2, respectively, and may be disposed across sub-pixels PXn arranged in the second direction DR2. For example, the third voltage line VL1 and the fourth voltage line VL2 may cross the first voltage line VDL and the second voltage line VSL. The third voltage lines VL1 and fourth voltage lines VL2 may be disposed over the entirety of the display area DPA, and may be spaced apart from each other in the first direction DR1.

The third voltage line VL1 may be connected (e.g., electrically connected) to the first voltage line VDL, and the fourth voltage line VL2 may be connected (e.g., electrically connected) to the second voltage line VSL. The third voltage line VL1 may transfer a signal applied through the first voltage line VDL to an electrode of the light emitting element ED, and the fourth voltage line VL2 may transfer a signal applied through the second voltage line VSL to another electrode of the light emitting element ED. A detailed description of the third voltage line VL1 and the fourth voltage line VL2 will be provided below.

Based on each pixel PX or sub-pixel PXn, the first voltage line VDL may be disposed on the lower side of the emission area EMA in plan view, and the second voltage line VSL may be disposed on the upper side of the emission area EMA in plan view. The first voltage line VDL and the second voltage line VSL connected to different sub-pixels PXn may be disposed adjacent to each other at a boundary area with another pixel PX or sub-pixel PXn adjacent in the second direction DR2.

The data line DTL, the fifth voltage line VIL, the second line pattern layer VL_D of the third voltage line VL1, and the fourth voltage line VL2 may be formed as a third conductive layer MCL3 disposed on the second conductive layer MCL2. The third conductive layer MCL3 may further include other conductive layers in addition to such lines.

In the display device 10 according to an embodiment, a circuit layer transferring signals for driving the light emitting elements ED may include the first to third conductive layers MCL1, MCL2, and MCL3. For example, the first voltage line VDL and the second voltage line VSL applying the source voltages to the light emitting elements ED may be disposed at the first conductive layer MCL1, respectively, and may be connected (e.g., electrically connected) to the third voltage line VL1 and the fourth voltage line VL2 disposed at the third conductive layer MCL3. The display device 10 may have an advantage in terms of manufacturing processes as the number of conductive layers constituting the circuit layer may be reduced. Hereinafter, a structure of each sub-pixel PXn will be described in more detail with further reference to other drawings.

Figure 5:
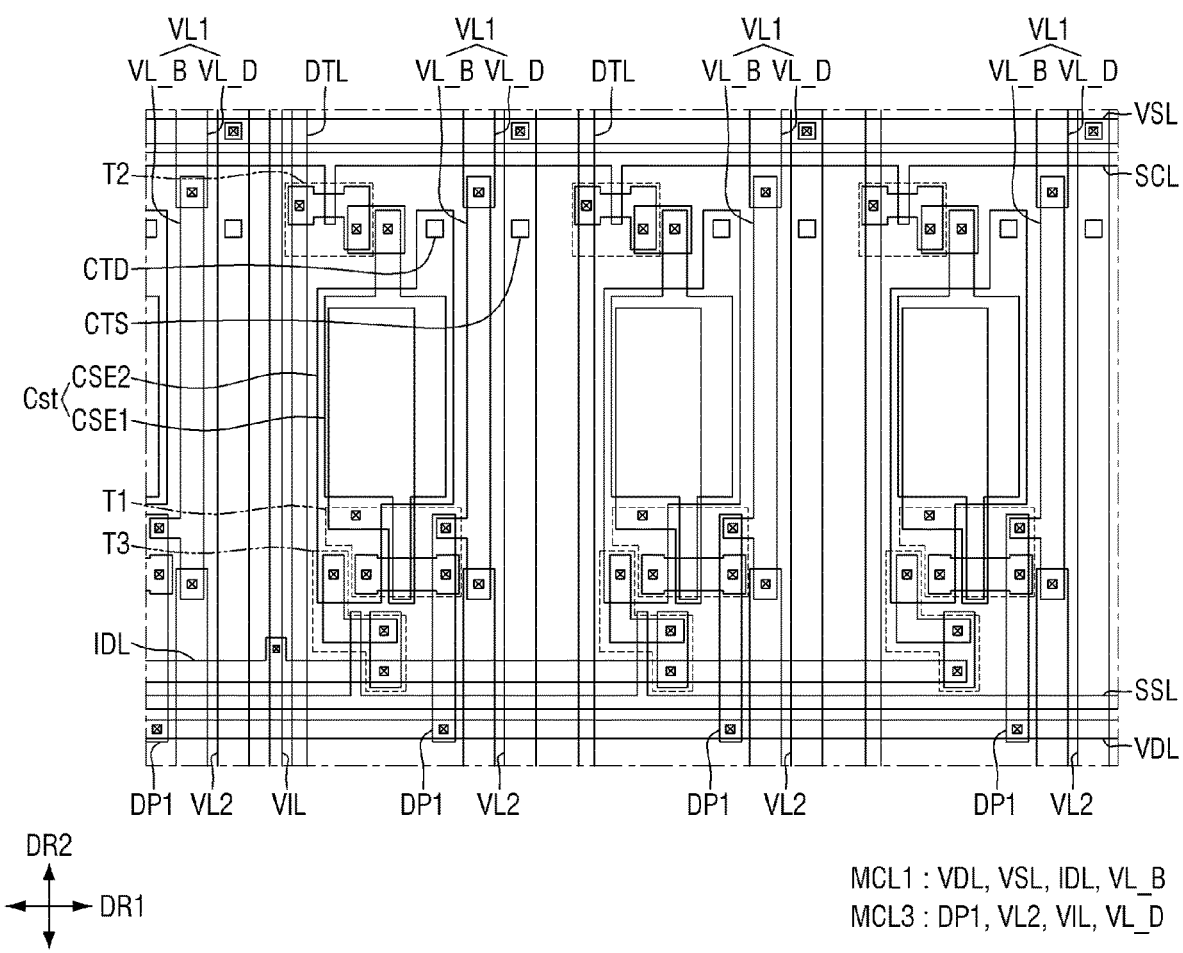
FIG. 5 is a schematic layout diagram illustrating conductive layers included in a pixel of the display device according to an embodiment.
Figure 6:
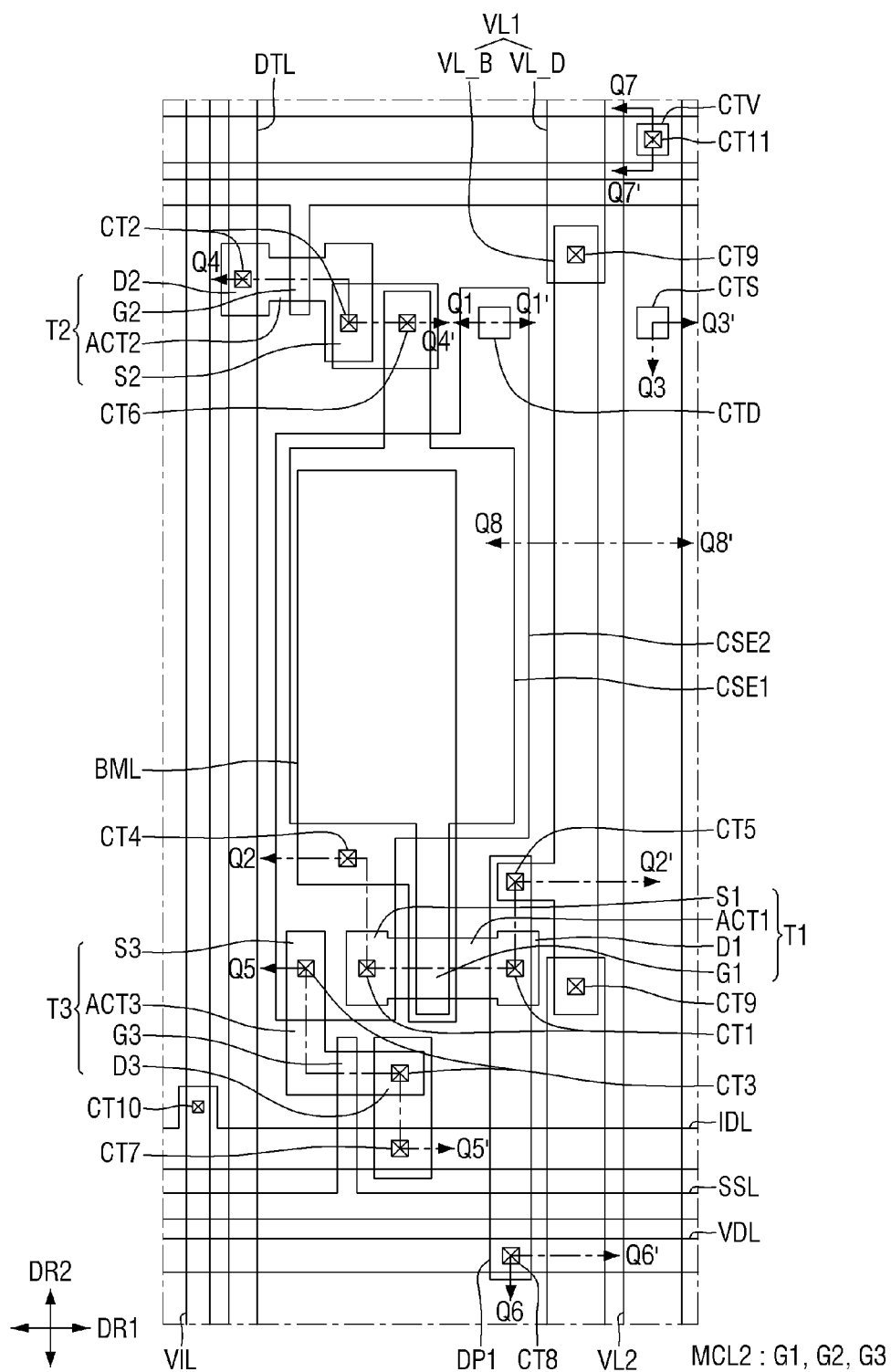
FIG. 6 is a schematic layout diagram illustrating conductive layers included in a sub-pixel of the display device according to an embodiment.
Figure 7:
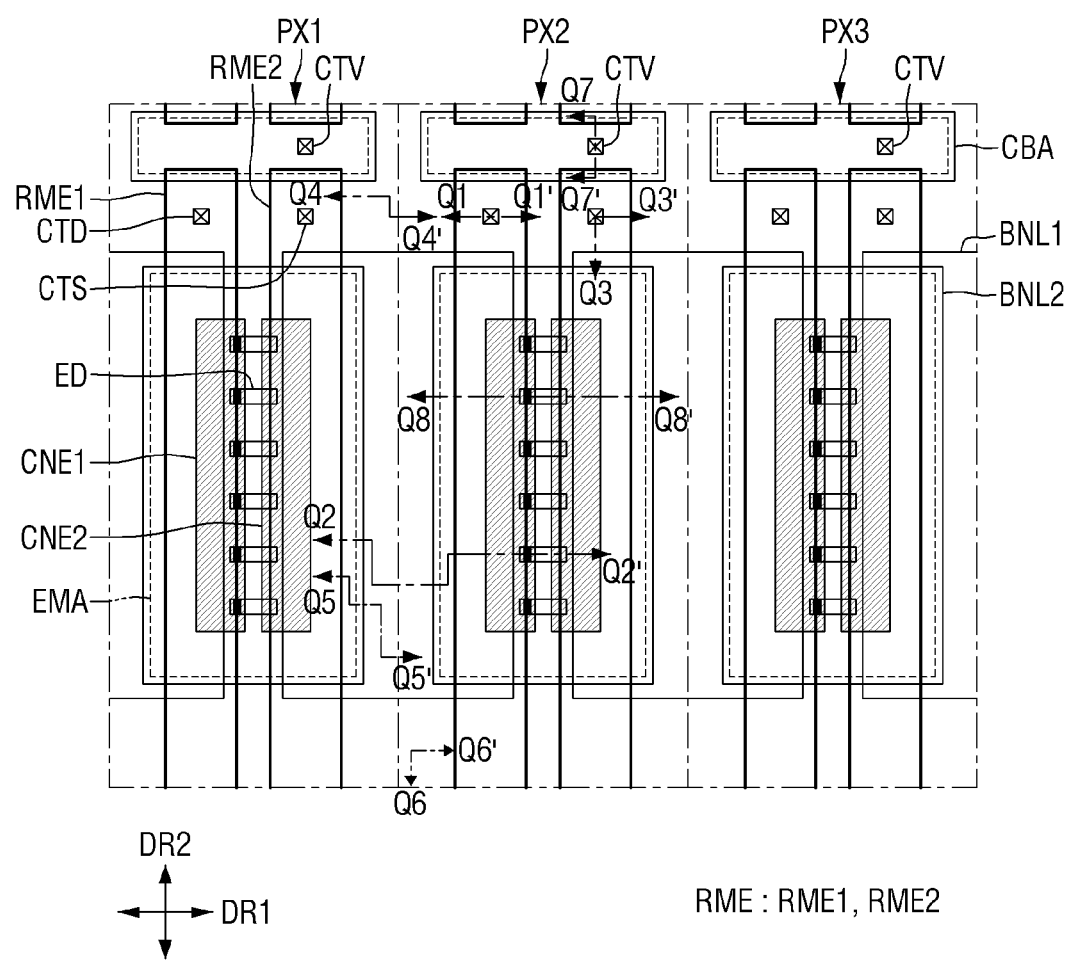
FIG. 7 is a schematic plan view illustrating electrodes and banks included in a pixel of the display device according to an embodiment.
Figure 8:
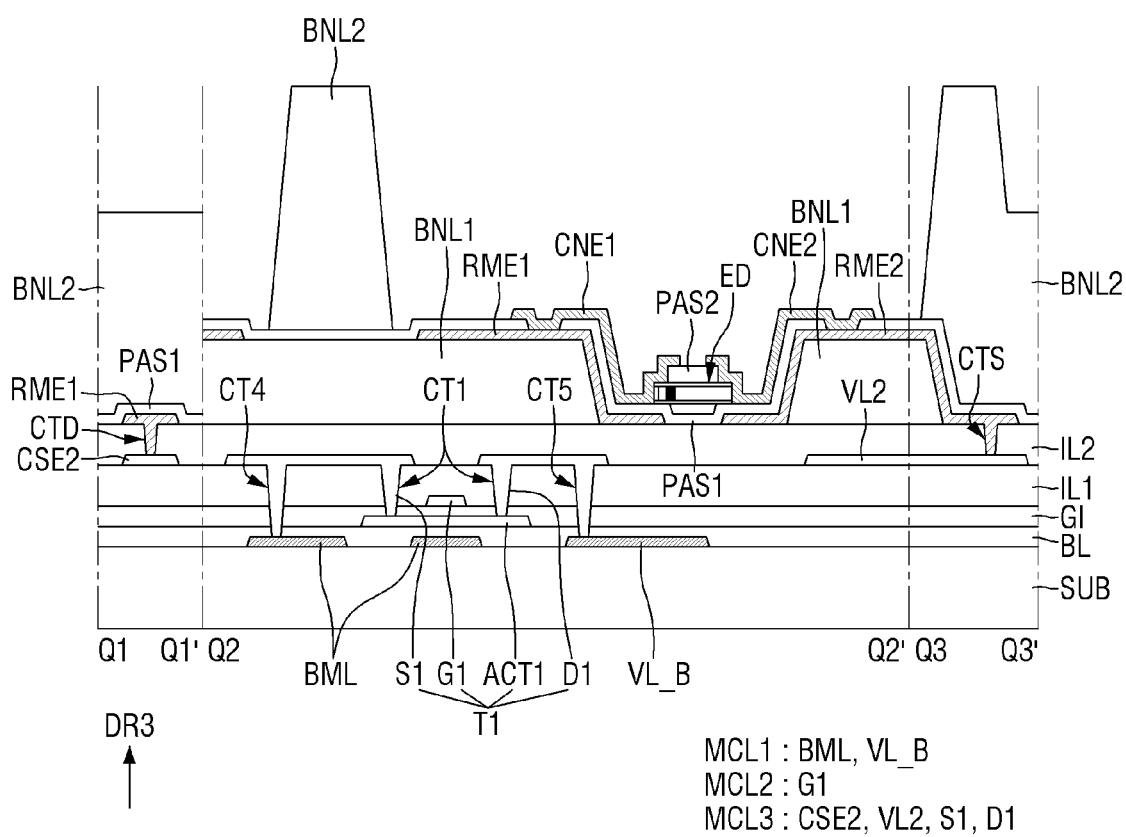
FIG. 8 is a schematic cross-sectional view taken along lines Q1-Q1', Q2-Q2', and Q3-Q3' of FIGS. 6 and 7.
Figure 9:
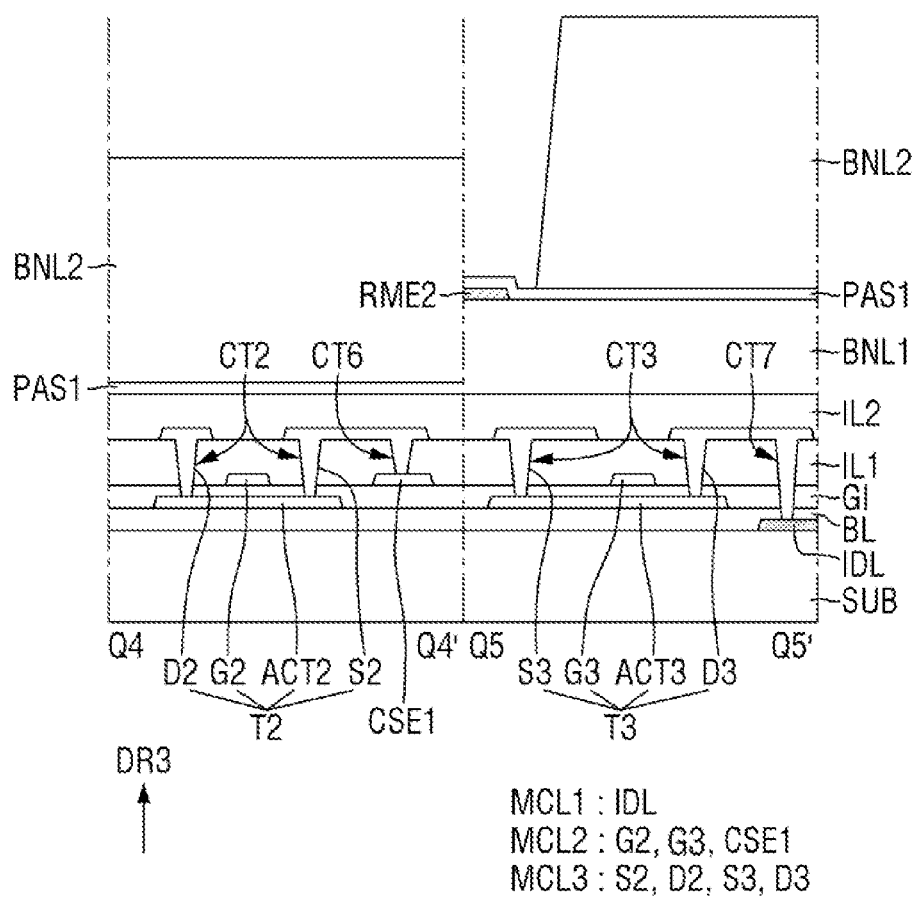
FIG. 9 is a schematic cross-sectional view taken along lines Q4-Q4' and Q5-Q5' of FIGS. 6 and 7.
Figure 10:
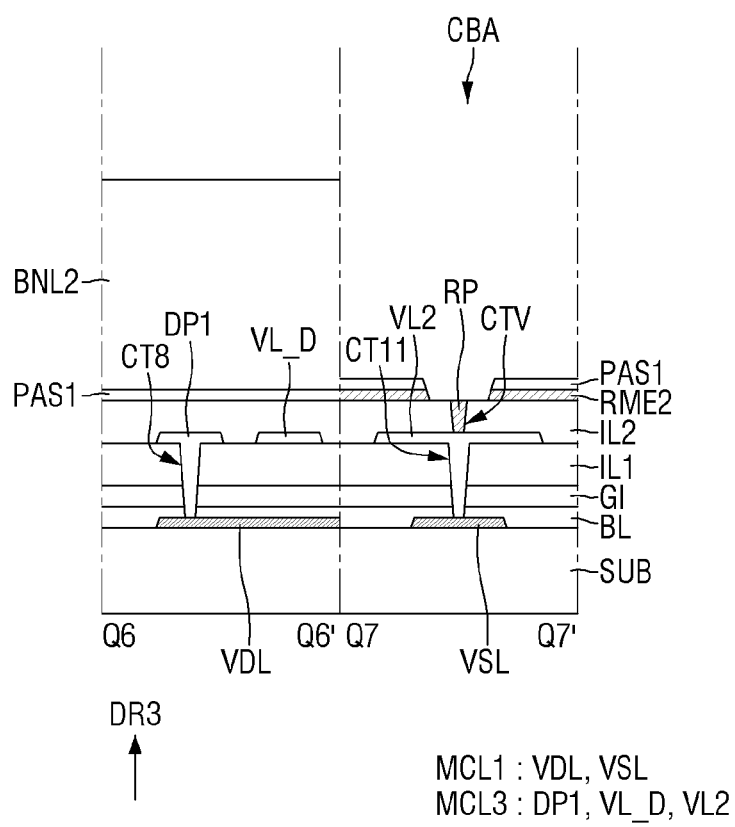
FIG. 10 is a schematic cross-sectional view taken along lines Q6-Q6' and Q7-Q7' of FIGS. 6 and 7.
Figure 11:
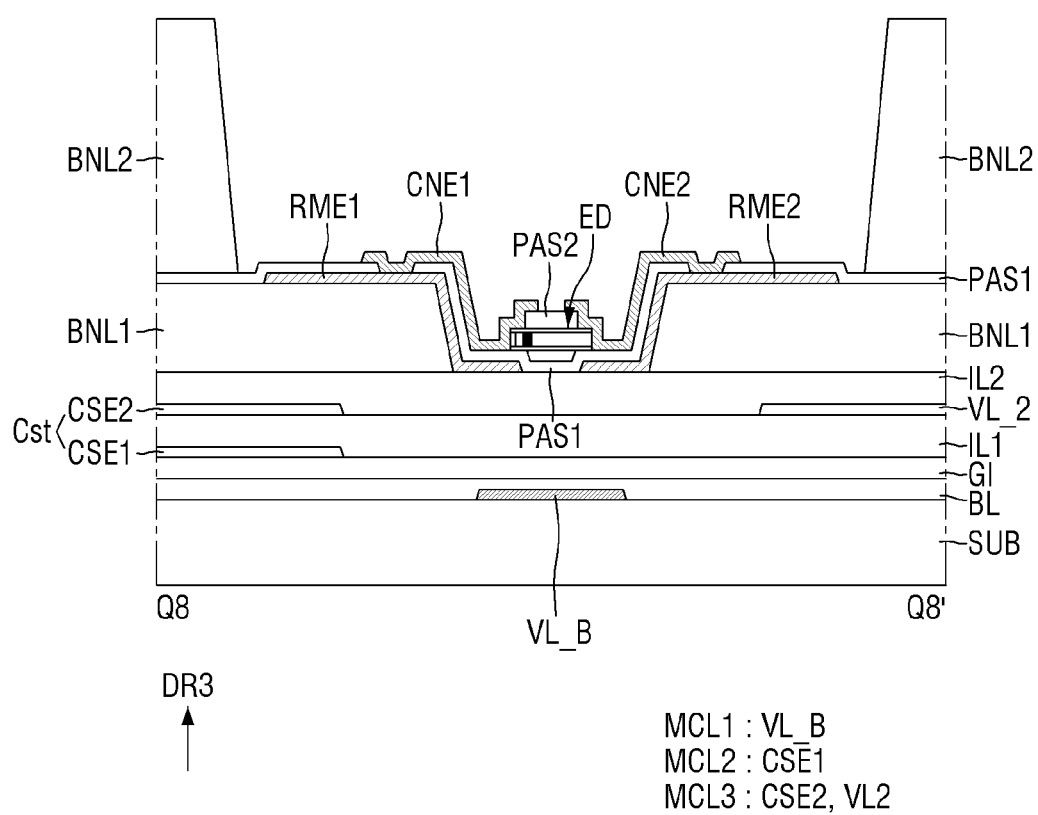
FIG. 11 is a schematic cross-sectional view taken along line Q8-Q8' of FIGS. 6 and 7.

FIG. 5 is a layout diagram illustrating conductive layers included in a pixel of the display device according to an embodiment. FIG. 6 is a layout diagram illustrating conductive layers included in a sub-pixel of the display device according to an embodiment. FIG. 7 is a schematic plan view illustrating electrodes and banks included in a pixel of the display device according to an embodiment. FIG. 8 is a schematic cross-sectional view taken along lines Q1-Q1', Q2-Q2', and Q3-Q3' of FIGS. 6 and 7. FIG. 9 is a schematic cross-sectional view taken along lines Q4-Q4' and Q5-Q5' of FIGS. 6 and 7. FIG. 10 is a schematic cross-sectional view taken along lines Q6-Q6' and Q7-Q7' of FIGS. 6 and 7. FIG. 11 is a schematic cross-sectional view taken along line Q8-Q8' of FIGS. 6 and 7.

FIG. 5 illustrates a circuit layer disposed to correspond to areas divided based on the second bank BNL2 of FIG. 4, and FIG. 6 illustrates only a circuit layer connected to an single sub-pixel PXn in the circuit layer of FIG. 5 regardless of the areas divided by the second bank BNL2.

For example, FIG. 7 illustrates a display element layer disposed in each pixel PX based on each sub-pixel PXn divided by the second bank BNL2. An arrangement of banks BNL1 and BNL2 and contact electrodes CNE1 and CNE2 in addition to respective electrodes RME1 and RME2 and light emitting elements ED is illustrated in FIG. 7. Cross-sections of the first transistor T1, the second transistor T2, and the third transistor T3 are illustrated in FIGS. 8 and 9, a cross section of a portion where voltage lines are connected to each other is illustrated in FIG. 10, and a cross section crossing end portions (e.g., opposite end portions) of the light emitting element ED is illustrated in FIG. 11.

Referring to FIGS. 5 to 11 in conjunction with FIG. 4, the display device 10 may include a circuit layer and a display element layer. The display element layer may be a layer at which a first electrode RME1 and a second electrode RME2 as well as the light emitting elements ED are disposed, and the circuit layer may be a layer in which lines as well as pixel circuit elements for driving the light emitting elements ED are disposed. For example, the circuit layer may include the respective transistors T1, T2, and T3 in addition to the first scan line SCL, the second scan line SSL, the data line DTL, the fifth voltage line VIL, the first voltage line VDL, the second voltage line VSL, the third voltage line VL1, and the fourth voltage line VL2.

For example, the display device 10 may include a first substrate SUB on which the circuit layer and display layers are disposed. The first substrate SUB may be an insulating substrate, and may be made of an insulating material such as glass, quartz, or a polymer resin. For example, the first substrate SUB may be a rigid substrate, but may also be a flexible substrate that is bendable, foldable, or rollable.

A first conductive layer MCL1 may be disposed on the first substrate SUB. The first conductive layer MCL1 may include the first voltage line VDL, the second voltage line VSL, a lower metal layer BML, the voltage distribution line IDL, and the first line pattern layer VL_B of the third voltage line VL1.

The first voltage line VDL and the second voltage line VSL may extend in the first direction DR1. The first voltage line VDL and the second voltage line VSL may be disposed at positions overlapping the second bank BNL2 in the third direction DR3, which is a thickness direction, in the non-emission area so as not to overlap the emission area EMA. The first voltage line VDL and the second voltage line VSL may be connected (e.g., electrically connected) to the pads WPD_VDD and WPD_VSS of the pad area PDA, respectively, and the first source voltage and the second source voltage may be applied to the first voltage line VDL and the second voltage line VSL, respectively. The first voltage line VDL may be connected (e.g., electrically connected) to the drain electrode of the first transistor T1 and the third voltage line VL1 through a first conductive pattern layer DP1 of a third conductive layer MCL3 to be described below. The second voltage line VSL may be connected (e.g., electrically connected) to the second electrode RME2 through a fourth voltage line VL2 of a third conductive layer MCL3 to be described below.

The first line pattern layer VL_B of the third voltage line VL1 may have a shape in which it extends in the second direction DR2, and may be disposed across the emission area EMA. According to an embodiment, the first line pattern layer VL_B of the third voltage line VL1 may overlap the light emitting elements ED in the thickness direction. As described below, in some embodiments, an insulating layer between the third conductive layer MCL3 and the electrodes RME1 and RME2 may be omitted, and portions of the electrodes RME1 and RME2 may be disposed at the same layer (or at the same level) as the third conductive layer MCL3. A structure of the third conductive layer MCL3 may be designed to ensure an area in which the electrodes RME1 and RME2 may be disposed, and the third voltage line VL1 may include the first line pattern layer VL_B connecting the second line pattern layers VL_D to another conductive layer in order to reflect such a structure. The first line pattern layer VL_B may be a bypass line connecting second line pattern layers VL_D of the third conductive layer MCL3 in an area in which the light emitting elements ED are disposed.

The voltage distribution line IDL may have a shape in which it extends in the first direction DR1, and may be disposed across the first to third sub-pixels PX1, PX2, and PX3. The voltage distribution line IDL may be connected (e.g., electrically connected) to a fifth voltage line VIL of a third conductive layer MCL3 and a drain electrode of a third transistor T3 to be described below, and may transfer the initialization voltage to the third transistor T3 of each sub-pixel PXn.

The lower metal layer BML may be disposed on the first substrate SUB. The lower metal layer BML may overlap a first active layer ACT1 of a semiconductor layer and a first capacitance electrode CSE1 of a second conductive layer MCL2 to be described below. The lower metal layer BML1 may include a material blocking light to prevent light from being incident on the active layer ACT1 of the first transistor. As an example, the lower metal layer BML may be made of an opaque metal material blocking transmission of the light. However, embodiments are not limited thereto, and in some cases, the lower metal layer BML may also be omitted or overlap active layers of the other transistors T1, T2, and T3.

A buffer layer BL may be disposed (e.g., entirely disposed) on the first substrate SUB with covering the first conductive layer MCL1. The buffer layer BL may be formed on the first substrate SUB in order to protect the respective transistors T1, T2, and T3 from moisture permeating through the first substrate SUB vulnerable to moisture permeation, and may perform a surface planarization function.

The semiconductor layer may be disposed on the buffer layer BL. The semiconductor layer may include active layers ACT1, ACT2, and ACT3 of each of the transistors T1, T2, and T3. The first active layer ACT1 of the first transistor T1 may be disposed adjacent to the center portion of each sub-pixel PXn and be disposed on the lower side of the center portion of each sub-pixel PXn. A second active layer ACT2 of the second transistor T2 may be disposed on the upper side of the center portion of each sub-pixel PXn, and a third active layer ACT3 of the third transistor T3 may be disposed on the lower side of the first active layer ACT1. In an embodiment, a portion of the first active layer ACT1 may overlap the lower metal layer BML. However, embodiments are not limited thereto.

In an embodiment, the semiconductor layer may include polycrystalline silicon, single crystal silicon, an oxide semiconductor, or the like. The polycrystalline silicon may be formed by crystallizing amorphous silicon. In case that the semiconductor layer includes the oxide semiconductor, each of the active layers ACT1, ACT2, and ACT3 may include conductive regions and a channel region disposed between the conductive regions. The oxide semiconductor may be an oxide semiconductor containing indium (In). In some embodiments, the oxide semiconductor may be indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO), or the like.

In another example, the semiconductor layer may include polycrystalline silicon. The polycrystalline silicon may be formed by crystallizing amorphous silicon. For example, each of the conductive regions of the active layers ACT1, ACT2, and ACT3 may be a doped region doped with impurities. However, embodiments are not limited thereto.

A first gate insulating layer GI may be disposed on the semiconductor layer and the buffer layer BL. For example, the first gate insulating layer GI may cover upper surfaces of the semiconductor layer and the buffer layer BL. The first gate insulating layer GI may function as a gate insulating film of each of the transistors.

The second conductive layer MCL2 may be disposed on the first gate insulating layer GI. The second conductive layer MCL2 may include gate electrodes G1, G2, and G3 of the respective transistors T1, T2, and T3, the first scan line SCL, the second scan line SSL, and a first capacitance electrode CSE1 of a storage capacitor Cst. A description of the first scan line SCL and the second scan line SSL is the same as that described above, and thus, gate electrodes and the first capacitance electrode CSE1 will be described below.

The gate electrodes G1, G2, and G3 of the second conductive layer MCL2 may partially overlap the active layers of the transistors T1, T2, and T3, respectively. For example, a first gate electrode G1 of the first transistor T1 may partially overlap the first active layer ACT1. The first gate electrode G1 may be connected (e.g., electrically connected) to and integral with a first capacitance electrode CSE1 of a storage capacitor Cst to be described below.

A second gate electrode G2 of the second transistor T2 may partially overlap the second active layer ACT2, and a third gate electrode G3 of the third transistor T3 may partially overlap the third active layer ACT3. The second gate electrode G2 may be electrically connected to the first scan line SCL, and the first scan signal may be applied to the second transistor T2. The third gate electrode G3 may be electrically connected to the second scan line SSL, and the second scan signal may be applied to the third transistor T3. In an embodiment, the second gate electrode G2 and the third gate electrode G3 may be integral with the first scan line SCL and the second scan line SSL, respectively. As described above, the first scan line SCL and the second scan line SSL may include portions protruding in the second direction DR2 toward the emission area EMA, and portions of the protruding portions may be the second gate electrode G2 and the third gate electrode G3, respectively.

The first capacitance electrode CSE1 of the storage capacitor Cst may be disposed between the first scan line SCL and the second scan line SSL. The first capacitance electrode CSE1 may be electrically connected to the first gate electrode G1 of the first transistor T1 and a source electrode of the second transistor T2. As an example, the first capacitance electrode CSE1 may be integral with the first gate electrode G1, and may be connected (e.g., electrically connected) to the source electrode of the second transistor T2 through a contact hole.

A first interlayer insulating layer IL1 may be disposed on the second conductive layer MCL2. The first interlayer insulating layer IL1 may cover the second conductive layer to function to protect the second conductive layer MCL2.

The third conductive layer MCL3 may be disposed on the first interlayer insulating layer IL1. The third conductive layer MCL3 may include the first conductive pattern layer DP1 in addition to source electrodes S1, S2, and S3 and drain electrodes D1, D2, and D3 of the respective transistors T1, T2, and T3, the data line DTL, the second line pattern layer VL_D of the third voltage line VL1, the fourth voltage line VL2, and a second capacitance electrode CSE2 of the storage capacitor Cst. A description of the data line DTL and the fifth voltage line VIL is the same as that described above with reference to FIG. 4, and a detailed description of the data line DTL and the fifth voltage line VIL will thus be omitted below.

A first source electrode S1 and a first drain electrode D1 of the first transistor T1 may partially overlap the first active layer ACT1. The first source electrode S1 and the first drain electrode D1 may be in contact with the first active layer ACT1 through first contact holes CT1 passing through the first interlayer insulating layer IL1 and the first gate insulating layer GI, respectively. For example, the first source electrode S1 may be in contact with the lower metal layer BML through a fourth contact hole CT4 passing through the first interlayer insulating layer IL1, the first gate insulating layer GI, and the buffer layer BL. The first drain electrode D1 may be electrically connected to the first voltage line VDL, and the first source electrode S1 may be connected (e.g., electrically connected) to the second capacitance electrode CSE2 of the storage capacitor Cst connected to the first electrode RME1. As an example, the first drain electrode D1 may be connected (e.g., electrically connected) to the first voltage line VDL through the first conductive pattern layer DP1, and the first source electrode S1 may be integral with and connected to the second capacitance electrode CSE2. The first transistor T1 may be turned on by a data signal transferred from the second transistor T2 to transfer the first source voltage to the first electrode RME1.

A second source electrode S2 and a second drain electrode D2 of the second transistor T2 may partially overlap second active layer ACT2. The second source electrode S2 and the second drain electrode D2 may be in contact with the second active layer ACT2 through second contact holes CT2 passing through the first interlayer insulating layer IL1 and the first gate insulating layer GI, respectively. The second drain electrode D2 may be integral with and connected to the data line DTL, and the second source electrode S2 may be in contact with the first capacitance electrode CSE1 through a sixth contact hole CT6 passing through the first interlayer insulating layer IL1. The second transistor T2 may be turned on by the first scan signal to transfer the data signal applied from the data line DTL to the first gate electrode G1 of the first transistor T1.

A third source electrode S3 and a third drain electrode D3 of the third transistor T3 may partially overlap the third active layer ACT3. The source electrode S3 and the third drain electrode D3 may be in contact with the third active layer ACT3 through third contact holes CT3 passing through the first interlayer insulating layer IL1 and the first gate insulating layer GI, respectively. For example, the third drain electrode D3 may be in contact with the voltage distribution line IDL through a seventh contact hole CT7 passing through the first interlayer insulating layer IL1, the first gate insulating layer GI, and the buffer layer BL, and the third source electrode S3 may be integral with and connected to the second capacitance electrode CSE2 of the storage capacitor Cst. The voltage distribution line IDL may be connected (e.g., electrically connected) to the fifth voltage line VIL through a tenth contact hole CT10 passing through the buffer layer BL, the first gate insulating layer GI, and the first interlayer insulating layer IL1 to receive the initialization voltage applied thereto, and the initialization voltage may be transferred to the third drain electrode D3. The third transistor T3 may be turned on by the second scan signal to transfer the initialization voltage to the first electrode RME1 through the second capacitance electrode CSE2.

The second capacitance electrode CSE2 of the storage capacitor Cst may overlap the first capacitance electrode CSE1. The second capacitance electrode CSE2 may be integral with and connected to the first source electrode S1 of the first transistor T1 and the third source electrode S3 of the third transistor T3. For example, as described below, the second capacitance electrode CSE2 may be electrically connected to the first electrode RME1 through a first electrode contact hole CTD passing through insulating layers disposed on the second capacitance electrode CSE2. It has been illustrated in the drawings that the second capacitance electrode CSE2 is in direct contact with the first electrode RME1, but embodiments are not limited thereto. In some embodiments, the second capacitance electrode CSE2 may be electrically connected to the first electrode RME1 through an electrode formed as a conductive layer disposed on the second capacitance electrode CSE2.

The first conductive pattern layer DP1 may overlap the first active layer ACT1, the first voltage line VDL, and the first line pattern layer VL_B. The first conductive pattern layer DP1 may be in contact with the first active layer ACT1 through the first contact hole CT1 passing through the first interlayer insulating layer IL1 and the first gate insulating layer GI to form the first drain electrode D1 of the first transistor T1. For example, the first conductive pattern layer DP1 may be in contact with the first line pattern layer VL_B through a fifth contact hole CT5 passing through the first interlayer insulating layer IL1, the first gate insulating layer GI, and the buffer layer BL, and may be in contact with the first voltage line VDL through an eighth contact hole CT8.

For example, the second line pattern layer VL_D of the third voltage line VL1 may have a shape in which it extends in the second direction DR2, and may be disposed across a boundary area between the sub-pixels PXn adjacent to each other in the second direction DR2. The second line pattern layer VL_D may be disposed in parallel with the first line pattern layer VL_B in plan view, and may partially overlap the first line pattern layer VL_B in the emission area EMA. The second line pattern layer VL_D may be in contact with the first line pattern layer VL_B through a ninth contact hole CT9 passing through the first interlayer insulating layer IL1, the first gate insulating layer GI, and the buffer layer BL at a portion where it overlaps the first line pattern layer VL_B. The first line pattern layer VL_B and the second line pattern layer VL_D may be connected (e.g., electrically connected) to each other to form one third voltage line VL1, and may be electrically connected to the first voltage line VDL through the first conductive pattern layer DP1.

The fourth voltage line VL2 may extend in the second direction DR2. The fourth voltage line VL2 may be in contact with the second voltage line VSL through an eleventh contact hole CT11 passing through the first interlayer insulating layer IL1, the first gate insulating layer GI, and the buffer layer BL at a portion where it overlaps the second voltage line VSL. The fourth voltage line VL2 may be in direct contact with and electrically connected to the second voltage line VSL. For example, as described below, the fourth voltage line VL2 may be electrically connected to the second electrode RME2 through a second electrode contact hole CTS passing through insulating layers disposed on the fourth voltage line VL2.

A second interlayer insulating layer IL2 may be disposed on the third conductive layer MCL3. The second interlayer insulating layer IL2 may function as an insulating film between the third conductive layer MCL3 and other layers disposed above the third conductive layer MCL3. For example, the second interlayer insulating layer IL2 may function to protect the third conductive layer MCL3 with covering the third conductive layer MCL3. For example, the second interlayer insulating layer IL2 may perform a surface planarization function. However, the second interlayer insulating layer IL2 may be omitted or integral with a first bank BNL1 described below.

Each of the first to third conductive layers MCL1, MCL2, and MCL3 described above may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. However, embodiments are not limited thereto.

For example, each of the buffer layer BL, the first gate insulating layer GI, the first interlayer insulating layer IL1, and the second interlayer insulating layer IL2 described above may be formed as a single layer or inorganic layers in which layers are stacked or the layers are alternately stacked. For example, each of the buffer layer BL, the first gate insulating layer GI, the first interlayer insulating layer IL1, and the second interlayer insulating layer IL2 may be formed as multiple layers in which inorganic layers including at least one of silicon oxide ($SiO_x$), silicon nitride ($SiN_x$), and silicon oxynitride ($SiO_xN_y$) are alternately stacked or a double layer in which silicon oxide ($SiO_x$) and silicon nitride ($SiN_x$) are sequentially stacked.

First banks BNL1, electrodes RME1 and RME2, the light emitting elements ED, the second bank BNL2, and contact electrodes CNE1 and CNE2 may be disposed on the second interlayer insulating layer IL2. For example, insulating layers PAS1 and PAS2 may be further disposed on the second interlayer insulating layer IL2.

The first banks BNL1 may be disposed (e.g., directly disposed) on the second interlayer insulating layer IL2. Each first bank BNL1 may have a shape in which it extends in the first direction DR1, and may be disposed across other sub-pixels PXn adjacent to each other. For example, the first bank BNL1 may have a shape in which it extends in the second direction DR2, and may be disposed in the emission area EMA of each sub-pixel PXn so as not to be disposed in sub-pixels PXn adjacent to each sub-pixel PXn in the second direction DR2. For example, each of the first banks BNL1 may have a certain width in the first direction DR1, such that a portion of each of the first banks BNL1 may be disposed in the emission area EMA and another portion thereof may be disposed at a boundary area between the sub-pixel PXn adjacent to each other in the first direction DR1. For example, a length of each of the first banks BNL1 measured in the second direction DR2 may be greater than a length of the emission area EMA measured in the second direction DR2, such that a portion of each of the first banks BNL1 may overlap the second bank BNL2 in the non-emission area.

First banks BNL1 may be disposed in each sub-pixel PXn. For example, in each sub-pixel PXn, two first banks BNL1 may be partially disposed in the emission area EMA. The two first banks BNL1 may be spaced apart from each other in the first direction DR1. The light emitting elements ED may be disposed between the first banks BNL1 spaced apart from each other in the first direction DR1. It has been illustrated in the drawings that two first banks BNL1 are disposed in the emission area EMA of each sub-pixel PXn to form an island-shaped pattern, but embodiments are not limited thereto. The number of first banks BNL1 disposed in the emission area EMA of each sub-pixel PXn may change according to the number of electrodes RME1 and RME2 or an arrangement of the light emitting elements ED.

The first bank BNL1 may have a structure in which at least a portion thereof protrudes from an upper surface of the second interlayer insulating layer IL2. The protruding portion of the first bank BNL1 may have inclined side surfaces, and the light emitted from the light emitting elements ED may be reflected from the electrodes RME1 and RME2 disposed on the first bank BNL1 and emitted in an upward direction of the second interlayer insulating layer IL2. The first bank BNL1 may function as a reflective wall reflecting the light emitted from the light emitting elements ED toward the upward direction with providing an area in which the light emitting elements ED are disposed. The side surfaces of the first banks BNL1 may be inclined in a linear shape, but embodiments are not limited thereto, and the first banks BNL1 may also have a semi-circular shape or a semi-elliptical shape with curved outer surfaces. The first banks BNL1 may include an organic insulating material such as polyimide (PI), but embodiments are not limited thereto.

The electrodes RME1 and RME2 may have a shape in which they extend in a direction, and may be disposed for each sub-pixel PXn. The electrodes RME1 and RME2 may have a shape in which they extend in the second direction DR2, and may be spaced apart from each other in the first direction DR1 and be disposed for each sub-pixel PXn. The first electrode RME1 and the second electrode RME2 spaced apart from the first electrode RME1 in the first direction DR1 may be disposed in each sub-pixel PXn. Light emitting elements ED may be disposed on the first electrode RME1 and the second electrode RME2. However, embodiments are not limited thereto, and positions of the electrodes RME1 and RME2 disposed in each sub-pixel PXn may change according to the number of electrodes RME1 and RME2 or the number of light emitting elements ED disposed in each sub-pixel PXn.

The first electrode RME1 and the second electrode RME2 may be disposed in the emission area EMA of each sub-pixel PXn, and portions of the first electrode RME1 and the second electrode RME2 may overlap the second bank BNL2 in the thickness direction beyond the emission area EMA. The electrodes RME1 and RME2 may extend in the second direction DR2 within the sub-pixel PXn, and may be spaced apart from electrodes RME1 and RME2 of another sub-pixel PXn in the second direction DR2 in the sub-area CBA.

Such an arrangement of the electrodes RME1 and RME2 may be implemented by forming electrode lines extending in the second direction DR2, disposing the light emitting elements ED, and separating the electrode lines from each other in a subsequent process. The electrode lines may generate an electric field in the sub-pixel PXn in order to align the light emitting elements ED in manufacturing processes of the display device 10. The light emitting elements ED may be jetted (or sprayed) onto the electrode lines through an inkjet printing process, and in case that ink including the light emitting elements ED is jetted (or sprayed) onto the electrode lines, an alignment signal may be applied to the electrode lines to generate an electric field. The light emitting elements ED may be disposed on the electrodes by the electric field formed between the electrode lines. The light emitting elements ED dispersed in the ink may be aligned on the electrodes RME by receiving a dielectrophoretic force by the generated electric field. The electrodes RME1 and RME2 may be formed by aligning the light emitting elements ED and disconnecting portions of the electrode lines.

In an embodiment, the first electrode RME1 and the second electrode RME2 may partially overlap the third voltage line VL1 and the fourth voltage line VL2 in the thickness direction, respectively. The respective electrodes RME1 and RME2 and the third and fourth voltage lines VL1 and VL2 may extend in the first direction DR1, respectively, at positions where they partially overlap each other in plan view. However, a portion where the first electrode RME1 overlaps the third voltage line VL1 in the thickness direction may be the first line pattern layer VL_B disposed at the first conductive layer MCL1, and a portion of the second electrode RME2 disposed on the first bank BNL1 may overlap the fourth voltage line VL2 in the thickness direction. In another example, even though the second interlayer insulating layer IL2 is omitted, such that portions of the first electrode RME1 and the second electrode RME2 may be disposed (e.g., directly disposed) on the first interlayer insulating layer IL1, the first electrode RME1 and the second electrode RME2 may be disposed (e.g., directly disposed) on the first interlayer insulating layer IL1 at portions where they do not overlap other lines of the third conductive layer MCL3.

The electrodes RME1 and RME2 disposed in each sub-pixel PXn may be disposed on the first banks BNL1 spaced apart from each other. The respective electrodes RME1 and RME2 may be disposed on sides of the first banks BNL1 in the first direction DR1 and disposed on the inclined side surfaces of the first banks BNL1. In an embodiment, a width of each of the electrodes RME1 and RME2 measured in the first direction DR1 may be smaller than a width of each of the first banks BNL1 measured in the first direction DR1. Each of the electrodes RME1 and RME2 may cover at least one side surface of the first bank BNL1 to reflect the light emitted from the light emitting elements ED.

For example, an interval (or distance) between the electrodes RME1 and RME2 spaced apart from each other in the first direction DR1 may be smaller than an interval (or distance) between the first banks BNL1. At least partial areas of the respective electrodes RME1 and RME2 may be disposed (e.g., directly disposed) on the second interlayer insulating layer IL2, such that the respective electrodes RME1 and RME2 may be disposed on the same plane.

The electrodes RME1 and RME2 may be electrically connected to the light emitting elements ED. For example, the electrodes RME1 and RME2 may be connected (e.g., electrically connected) to the third conductive layer MCL3, such that signals for emitting light from the light emitting elements ED may be applied to the electrodes RME1 and RME2. The first electrode RME1 may be electrically connected to the third conductive layer MCL3 through the first electrode contact hole CTD, and the second electrode RME2 may be electrically connected to the third conductive layer MCL3 through the second electrode contact hole CTS. For example, the first electrode RME1 may be in contact with the second capacitance electrode CSE2 through the first electrode contact hole CTD formed in an area in which it overlaps the second bank BNL2. The second electrode RME2 may be in contact with the fourth voltage line VL2 through the second electrode contact hole CTS formed in an area in which it overlaps the second bank BNL2. The first electrode RME1 may be electrically connected to the first transistor T1 through the second capacitance electrode CSE2 to receive the first source voltage applied thereto, and the second electrode RME2 may be electrically connected to the second voltage line VSL through the fourth voltage line VL2 to receive the second source voltage applied thereto. Since the respective electrodes RME1 and RME2 are separated for each sub-pixel PXn, the light emitting elements ED of different sub-pixels PXn may individually emit light.

It has been illustrated in the drawings that the first electrode contact hole CTD and the second electrode contact hole CTS are formed at positions overlapping the second bank BNL2, but embodiments are not limited thereto, positions of the first electrode contact hole CTD and the second electrode contact hole CTS may be variously modified. For example, the first electrode contact hole CTD and the second electrode contact hole CTS may be positioned in the emission area EMA surrounded by the second bank BNL2, and in some embodiments, a larger number of contact holes may be formed.

Each of the electrodes RME1 and RME2 may include a conductive material having high reflectivity. For example, each of the electrodes RME1 and RME2 may include a metal such as silver (Ag), copper (Cu), or aluminum (Al), or include an alloy including aluminum (Al), nickel (Ni), lanthanum (La), or the like, as the material having the high reflectivity. Each of the electrodes RME1 and RME2 may reflect the light emitted from the light emitting elements ED and traveling (or transmitting) toward the side surfaces of the first banks BNL1 in an upward direction of each sub-pixel PXn.

However, embodiments are not limited thereto, and each of the electrodes RME1 and RME2 may further include a transparent conductive material. For example, each of the electrodes RME1 and RME2 may include a material such as ITO, IZO, or ITZO. In some embodiments, each of the electrodes RME may have a structure in which one or more layers made of a transparent conductive material and one or more layers made of a metal having high reflectivity are stacked or may be formed as one layer including the transparent conductive material and the metal having the high reflectivity. For example, each of the electrodes RME1 and RME2 may have a stacked structure such as ITO/Ag/ITO, ITO/Ag/IZO, or ITO/Ag/ITZO/IZO.

As described above, the first electrode RME1 and the second electrode RME2 may be separated from the electrodes RME1 and RME2 of another sub-pixel PXn in the sub-area CBA. The second electrode RME2 may be in contact with the fourth voltage line VL2 through a contact hole formed in the sub-area CBA before being separated from other neighboring sub-pixels PXn. According to an embodiment, a third electrode contact hole CTV formed in the sub-area CBA surrounded by the second bank BNL2 may be further included, and a pattern part RP disposed inside the third contact hole CTV may be included. The electrodes RME1 and RME2 of other sub-pixels PXn adjacent to each other in the second direction DR2 may be separated from each other by a process of forming single electrode lines connected to each other and cutting the single electrode lines among the manufacturing processes of the display device 10.

The electrode line may be in contact with the fourth voltage line VL2 through the third electrode contact hole CTV as well as the second electrode contact hole CTS. A signal for aligning the light emitting elements ED may be applied to the electrode line and the fourth voltage line VL2, and the signal applied to the fourth voltage line VL2 may be applied to the electrode line through the second and third electrode contact holes CTS and CTV. After the light emitting elements ED are aligned, a process of separating the electrode lines from each other to separate the electrodes RME1 and RME2 from each other may be performed. In such a process, a portion disposed on the second interlayer insulating layer IL2 may be removed, and the pattern part RP made of the same material as a material of the second electrode RME2 may remain inside the third electrode contact hole CTV. The third electrode contact hole CTV may be an area in which the second voltage line VSL and the fourth voltage line VL2 cross each other, and may be disposed on an area in which the eleventh contact hole CT11 is formed. For example, the third electrode contact hole CTV may overlap the eleventh contact hole CT11 in the thickness direction. However, embodiments are not limited thereto, and the third electrode contact hole CTV and the pattern part RP may be omitted, and only the electrodes RME1 and RME2 may be disposed in a state in which they are separated from each other in the sub-area CBA.

A first insulating layer PAS1 may be disposed on the electrodes RME1 and RME2 and the first banks BNL1. The first insulating layer PAS1 may cover the first banks BNL1, the first electrode RME1, and the second electrode RME2, but portions of upper surfaces of the first electrode RME1 and the second electrode RME2 may be exposed. Openings exposing the portions of the upper surfaces of the respective electrodes RME1 and RME2 disposed on the first banks BNL1 may be formed in the first insulating layer PAS1, and the contact electrodes CNE1 and CNE2 may be in contact with the electrodes RME1 and RME2 through the openings, respectively.

In an embodiment, the first insulating layer PAS1 may have a step so that a portion of an upper surface of the first insulating layer PAS1 may be recessed between the first electrode RME1 and the second electrode RME2. The first insulating layer PAS1 may cover the first electrode RME1 and the second electrode RME2, and may be stepped between the first electrode RME1 and the second electrode RME2. However, embodiments are not limited thereto. The first insulating layer PAS1 may insulate the first electrode RME1 and the second electrode RME2 from each other and may protect the first electrode RME1 and the second electrode RME2. For example, the first insulating layer PAS1 may prevent the light emitting elements ED disposed on the first insulating layer PAS1 from being in direct contact with and from being damaged by other members.

The second bank BNL2 may be disposed on the first insulating layer PAS1. The second bank BNL2 may be disposed in a lattice pattern by including portions extending in the first direction DR1 and the second direction DR2 in plan view. The second bank BNL2 may be disposed across a boundary area between the respective sub-pixels PXn to divide adjacent sub-pixels PXn. For example, the second bank BNL2 may surround the emission area EMA and the sub-area CBA disposed in each sub-pixel PXn to divide the emission area EMA and the sub-area CBA. A portion disposed between the emission areas EMA in a portion of the second pattern layer BNL2 extending in the second direction DR2 may have a greater width than a portion disposed between the sub-areas CBA. Accordingly, an interval (or distance) between the sub-areas CBA may be smaller than an interval (or distance) between the emission areas EMA.

The second bank BNL2 may have a greater height than the first bank BNL1. The second bank BNL2 may prevent inks from overflowing into adjacent sub-pixels PXn in an inkjet printing process of the manufacturing processes of the display device 10 to separate inks in which different light emitting elements ED are dispersed for each of different sub-pixels PXn from each other so that the inks may not be mixed with each other. A first bank BNL1 may be disposed across the sub-pixels PXn adjacent to each other in the first direction DR1. Thus, a portion of the second bank BNL2 extending in the second direction DR2 may be disposed on a bank BNL1. The second bank BNL2 may include polyimide (PI) like the first bank BNL1, but embodiments are not limited thereto.

The light emitting elements ED may be disposed on the first insulating layer PAS1. The light emitting elements ED may be spaced apart from each other along the second direction DR2 in which the respective electrodes RME1 and RME2 extend, and may be aligned to be substantially parallel to each other. The light emitting elements ED may have a shape in which they extend in a direction, and a direction in which the respective electrodes RME1 and RME2 extend and a direction in which the light emitting elements ED extend may be substantially perpendicular to each other. However, embodiments are not limited thereto, and the light emitting elements ED may also be oblique to the direction in which the respective electrodes RME1 and RME2 extend.

The light emitting element ED may include semiconductor layers doped with different conductivity types of dopants. The light emitting element ED may include semiconductor layers, and may be oriented so that an end portion thereof may face a specific direction according to a direction of an electric field generated on the electrodes RME1 and RME2. For example, the light emitting element ED may include a light emitting layer 36 (see FIG. 13) to emit light of a specific wavelength band. The light emitting elements ED disposed in each sub-pixel PXn may emit light of different wavelength bands according to a material of the light emitting layer 36 However, embodiments are not limited thereto, and the light emitting elements ED disposed in each sub-pixel PXn may emit light of the same color.

The light emitting elements ED may be disposed on the respective electrodes RME1 and RME2 between the first banks BNL1. For example, the light emitting elements ED may be disposed so that end portions thereof may be disposed on the first electrode RME1 and the other end portions thereof may be disposed on the second electrode RME2. An extension length of the light emitting elements ED may be greater than the interval (or distance) between the first electrode RME1 and the second electrode RME2, and end portions (e.g., opposite end portions) of the light emitting elements ED may be disposed on the first electrode RME1 and the second electrode RME2, respectively.

According to an embodiment, the light emitting elements ED disposed on the electrodes RME1 and RME2 may overlap the first line pattern layer VL_B of the first conductive layer MCL1 in the thickness direction. The third conductive layer MCL3 may be disposed below the second interlayer insulating layer IL2, and the third voltage line VL1 may be disposed in an area overlapping the light emitting elements ED in the thickness direction. However, as described below, in some embodiments, the second interlayer insulating layer IL2 may be omitted. For example, the electrodes RME1 and RME2, on which the light emitting elements ED are disposed, may be disposed at the same layer (or at the same level) as the third conductive layer MCL3. The third voltage line VL1 may include the first line pattern layer VL_B disposed at (or formed of) the first conductive layer MCL1 so that a space, in which the electrodes RME1 and RME2 are disposed on the same layer (or at the same level) as the third conductive layer MCL3, may be ensured, and the first line pattern layer VL_B may overlap the area in which the light emitting elements ED are disposed. The first line pattern layer VL_B may be disposed below the light emitting elements ED, such that the third voltage line VL1 may be bypassed and connected. Accordingly, even though the second interlayer insulating layer IL2 is omitted, the electrodes RME1 and RME2 may be spaced apart, separated, or electrically insulated from other lines of the third conductive layer MCL3.

The light emitting element ED may include layers disposed in a direction parallel to an upper surface of the first substrate SUB. The light emitting element ED of the display device 10 may be disposed so that a direction in which the light emitting element ED extends is parallel to the first substrate SUB, and the semiconductor layers included in the light emitting element ED may be sequentially disposed along the direction parallel to the upper surface of the first substrate SUB. However, embodiments are not limited thereto. In case that the light emitting element ED has another structure, the layers may also be disposed in a direction perpendicular to the first substrate SUB.

End portions (e.g., opposite end portions) of the light emitting elements ED may be in contact with the contact electrodes CNE1 and CNE2, respectively. An insulating film 38 (see FIG. 13) may not be formed on end surfaces of the light emitting element ED in a direction in which the light emitting element ED extends and some of the semiconductor layers may be exposed. Thus, the exposed semiconductor layers may be in contact with the contact electrodes CNE1 and CNE2, respectively. However, embodiments are not limited thereto. In some cases, at least partial areas of the insulating film 38 of the light emitting element ED may be removed and the insulating film 38 is removed, such that side surfaces of end portions (e.g., opposite end portions) of the semiconductor layers may be partially exposed. The exposed side surfaces of the semiconductor layers may also be in direct contact with the contact electrodes CNE1 and CNE2.

A second insulating layer PAS2 may be partially disposed on the light emitting elements ED. As an example, the second insulating layer PAS2 may partially surround outer surfaces of the light emitting elements ED, and may be disposed so as not to cover end portions and the other end portions of the light emitting elements ED. Contact electrodes CNE1 and CNE2 to be described below may be in contact with end portions (e.g., opposite end portions) of the light emitting elements ED that are not covered by the second insulating layer PAS2, respectively. Portions of the second insulating layer PAS2 disposed on the light emitting elements ED may extend in the second direction DR2 on the first insulating layer PAS1 in plan view to form a linear or island-shaped pattern within each sub-pixel PXn. The second insulating layer PAS2 may fix the light emitting elements ED in the manufacturing processes of the display device 10 with protecting the light emitting elements ED.

For example, a cutting process of forming the respective electrodes RME1 and RME2 by forming the electrode lines and separating the electrode lines from each other among the manufacturing processes of the display device 10 may be performed after the second insulating layer PAS2 is formed. The second insulating layer PAS2 may not be disposed in the sub-area CBA, and may be disposed only in the emission area EMA, and only the electrodes RME1 and RME2 and the first insulating layer PAS1 may be disposed in the sub-area CBA. In the sub-area CBA, the electrodes RME1 and RME2 may be spaced apart from each other. Thus, the second interlayer insulating layer IL2 may be exposed, and the first insulating layer PAS1 may be separated and disposed on the separated electrodes RME1 and RME2. As described above, the third electrode contact hole CTV and the pattern part RP may be disposed in the sub-area CBA, and an upper surface of the pattern part RP disposed inside the third electrode contact hole CTV may be exposed.

The contact electrodes CNE1 and CNE2 may be disposed on the second insulating layer PAS2. The contact electrodes CNE1 and CNE2 may include a first contact electrode CNE1 and a second contact electrode CNE2. The first contact electrode CNE1 and the second contact electrode CNE2 may be disposed on portions of the first electrode RME1 and the second electrode RME2, respectively. The first contact electrode CNE1 may be disposed on the first electrode RME1, the second contact electrode CNE2 may be disposed on the second electrode RME2, and each of the first contact electrode CNE1 and the second contact electrode CNE2 may have a shape in which it extends in the second direction DR2. The first contact electrode CNE1 and the second contact electrode CNE2 may be spaced apart from and face each other in the first direction DR1, and may form a linear pattern in the emission area EMA of each sub-pixel PXn.

In some embodiments, widths of the first contact electrode CNE1 and the second contact electrode CNE2 measured in a direction may be smaller than widths of the first electrode RME1 and the second electrode RME2 measured in the direction, respectively. The first contact electrode CNE1 and the second contact electrode CNE2 may cover portions of the upper surfaces of the first electrode RME1 and the second electrode RME2 with being in contact with end portions and the other end portions of the light emitting elements ED, respectively.

The contact electrodes CNE1 and CNE2 may be in contact with the light emitting elements ED and the electrodes RME1 and RME2, respectively. The light emitting elements ED may have semiconductor layers exposed on end surfaces (e.g., opposite end surfaces) thereof in the direction in which they extend. The first contact electrode CNE1 and the second contact electrode CNE2 may be in contact with the light emitting elements ED on the end surfaces on which the semiconductor layers are exposed. End portions of the light emitting elements ED may be electrically connected to the first electrode RME1 through the first contact electrode CNE1, and the other end portions of the light emitting elements ED may be electrically connected to the second electrode RME2 through the second contact electrode CNE2.

It has been illustrated in the drawings that a single first contact electrode CNE1 and a single second contact electrode CNE2 are disposed in a single sub-pixel PXn, but embodiments are not limited thereto. The numbers of first contact electrodes CNE1 and second contact electrodes CNE2 may change according to the numbers of first electrodes RME1 and second electrodes RME2 disposed in each sub-pixel PXn.

The contact electrodes CNE1 and CNE2 may include a conductive material. For example, the contact electrodes CNE1 and CNE2 may include ITO, IZO, ITZO, aluminum (Al), or the like. As an example, the contact electrodes CNE1 and CNE2 may include a transparent conductive material, and the light emitted from the light emitting elements ED may be transmitted through the contact electrodes CNE1 and CNE2 and may travel (or transmit) toward the electrodes RME1 and RME2. However, embodiments are not limited thereto.

For example, an insulating layer covering the contact electrodes CNE1 and CNE2 and the second bank BNL2 may be further disposed on the contact electrodes CNE1 and CNE2 and the second bank BNL2. The insulating layer may be disposed (e.g., entirely disposed) on the first substrate SUB to function to protect other members from an external environment.

Each of the first insulating layer PAS1 and the second insulating layer PAS2 described above may include an inorganic insulating material or an organic insulating material. In an embodiment, the first insulating layer PAS1 and the second insulating layer PAS2 may include at least one inorganic insulating material such as silicon oxide ($SiO_x$), silicon nitride ($SiN_x$), silicon oxynitride ($SiO_xN_y$), aluminum oxide ($Al_xO_y$), or aluminum nitride ($Al_xN_y$). In another example, the first insulating layer PAS1 and the second insulating layer PAS2 may include at least one organic insulating material such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, embodiments are not limited thereto.

The display device 10 according to an embodiment may include not only the first voltage lines VDL and the second voltage lines VSL connected to the pads WPD of the pad area PDA. Further, the third voltage lines VL1 and the fourth voltage lines VL2 electrically connected to the first voltage lines VDL and the second voltage lines VSL. In the display device 10, lines to which the source voltages for driving the light emitting elements ED are applied may be disposed in a mesh structure in the entirety of the display area DPA. The lines to which the source voltages are applied may be disposed at the uppermost layer of the circuit layer in order to be connected (e.g., electrically connected) to a first electrode RME1 and a second electrode RME2 described below. Since the circuit layer includes the source/drain electrodes of the transistors T1, T2, and T3, the data lines DTL, and the fifth voltage lines VIL, it may be difficult to ensure a space enough for the lines to which the source voltages are applied to be disposed in the third conductive layer MCL3 including the source/drain electrodes of the transistors T1, T2, and T3, the data lines DTL, and the fifth voltage lines VIL.

However, in the display device 10 according to an embodiment, the lines to which the source voltages are applied are separately formed at the first conductive layer MCL1 and the third conductive layer MCL3, such that only a minimum space may be allocated to the third conductive layer MCL3 and the source voltage lines may be disposed. Since the first voltage lines VDL and the second voltage lines VSL connected to the pads WPD are formed as the first conductive layer MCL1, a spatial restriction in forming pattern layers may be minimized, and since the third voltage lines VL1 or the fourth voltage lines VL2 connected to the respective electrodes RME1 and RME2 may be formed as the third conductive layer MCL3, the source voltages may be transferred to the light emitting elements ED without a short circuit issue. For example, the first voltage lines VDL and the second voltage lines VSL may be formed as the first conductive layer MCL1. Thus, a thickness of the first voltage lines VDL and the second voltage lines VSL may be greater than that of the third conductive layer MCL3 and a resistance of the lines to which the source voltages are applied may be decreased. In the display device 10 according to an embodiment, by separately disposing the lines applying the source voltages at different conductive layers, the number of conductive layers required for the circuit layer may be decreased, such that the manufacturing processes of the display device 10 may be simplified.

Figure 12:
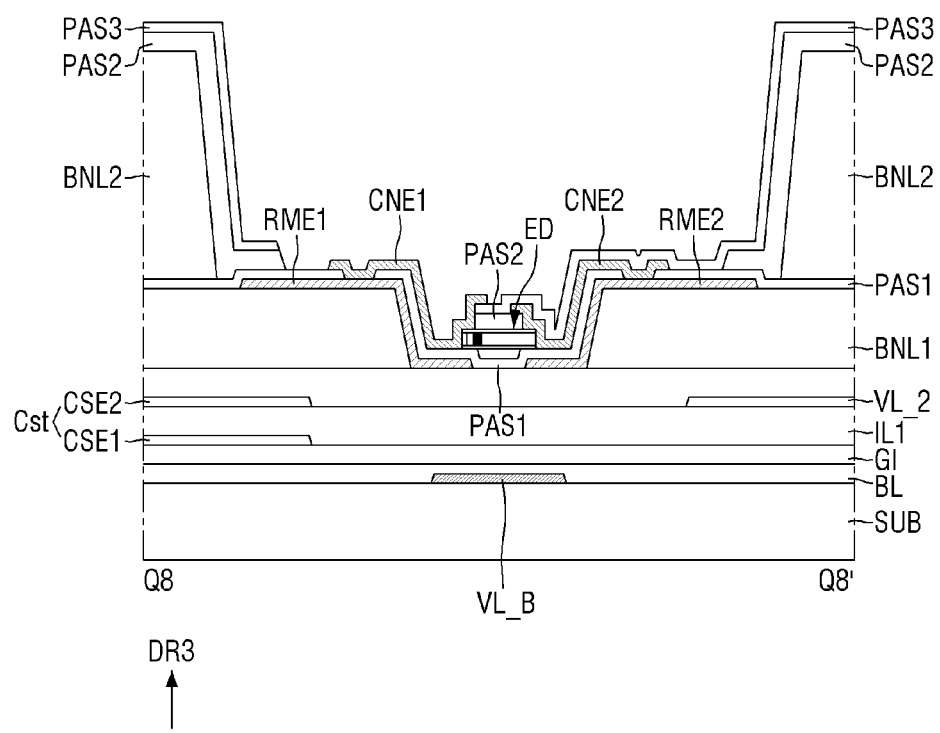
FIG. 12 is a schematic cross-sectional view illustrating a portion of a display device according to an embodiment.

FIG. 12 is a schematic cross-sectional view illustrating a portion of a display device according to an embodiment.

Referring to FIG. 12, a display device 10 according to an embodiment may further include a third insulating layer PAS3 insulating the first contact electrode CNE1 and the second contact electrode CNE2 from each other. The third insulating layer PAS3 may be disposed on the second insulating layer PAS2, and the first contact electrode CNE1 may be disposed on the third insulating layer PAS3. Unlike the embodiment of FIG. 11, in an embodiment, the first contact electrode CNE1 and the second contact electrode CNE2 may be disposed at different layers and be insulated from each other by the third insulating layer PAS3. For example, the display device 10 may further include the third insulating layer PAS3, and accordingly, an arrangement of the second insulating layer PAS2 may be partially changed.

The second insulating layer PAS2 may be partially disposed on the first bank BNL1 and the second bank BNL2 and may surround the light emitting elements ED. A portion of the second insulating layer PAS2 may be disposed (e.g., directly disposed) on the first insulating layer PAS1 on the first bank BNL1, and another portion of the second insulating layer PAS2 may be disposed (e.g., directly disposed) on the second bank BNL2. Such a second insulating layer PAS2 may be formed by a process of disposing (e.g., entirely disposing) the second insulating layer PAS2 on the first insulating layer PAS1 and the second bank BNL2 and removing the second insulating layer PAS2 so as to expose end portions (e.g., opposite end portions) of the light emitting elements ED.

The third insulating layer PAS3 may be disposed on the second contact electrode CNE2. For example, the third insulating layer PAS3 may also be disposed on the second insulating layer PAS2 excluding an area in which the second contact electrode CNE2 is disposed. The third insulating layer PAS3 may be formed by a process of disposing the third insulating layer PAS3 on the first insulating layer PAS1, the second insulating layer PAS2, and the second bank BNL2, by a process of covering the second contact electrode CNE2, and by a process of removing the third insulating layer PAS3 so as to expose end portions of the light emitting elements ED.

Figure 13:
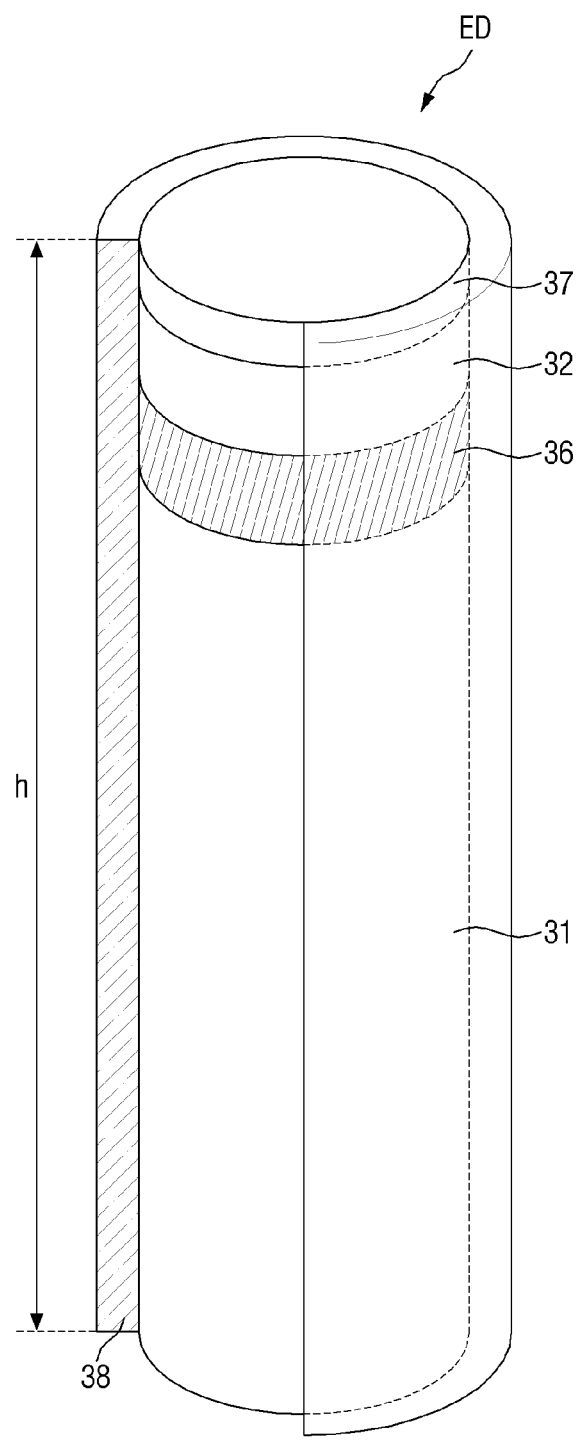
FIG. 13 is a schematic view of a light emitting element according to an embodiment.

FIG. 13 is a schematic view of a light emitting element according to an embodiment.

The light emitting element ED may be a light emitting diode. For example, the light emitting element ED may be an inorganic light emitting diode having a size of a micrometer or nanometer unit and made of an inorganic material or an inorganic semiconductor. The inorganic light emitting diodes may be aligned between two electrodes in which polarities are formed in case that an electric field is formed in a specific direction between the two electrodes facing each other. The light emitting elements ED may be aligned between the two electrodes by the electric field formed on the two electrodes.

The light emitting element ED according to an embodiment may have a shape in which it extends in a direction. The light emitting element ED may have a shape such as a rod shape, a wire shape, or a tube shape. In an embodiment, the light emitting element ED may have a cylindrical shape or a rod shape. However, the light emitting element ED is not limited to having the shape described above, and may have various shapes. For example, the light emitting element ED may have a polygonal prismatic shape such as a cubic shape, a rectangular parallelepiped shape, or a hexagonal prismatic shape or have a shape in which it extends in a direction and has partially inclined outer surfaces. Semiconductors included in a light emitting element ED to be described below may have a structure in which they are sequentially disposed or stacked along the direction.

The light emitting element ED may include a semiconductor layer doped with any conductivity-type impurities (e.g., p-type or n-type dopants). The semiconductor layer may receive an electrical signal applied from an external power source to emit light of a specific wavelength band.

Referring to FIG. 13, the light emitting element ED may include a first semiconductor layer 31, a second semiconductor layer 32, a light emitting layer 36, an electrode layer 37, and an insulating film 38.

The first semiconductor layer 31 may be an n-type semiconductor. As an example, in case that the light emitting element ED emits light of a blue wavelength band, the first semiconductor layer 31 may include a semiconductor material having a chemical formula: $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with an n-type dopant. The first semiconductor layer 31 may be doped with an n-type dopant, which includes Si, Ge, Sn, or the like, as an example. In an embodiment, the first semiconductor layer 31 may be made of n-GaN doped with n-type Si. A length of the first semiconductor layer 31 may be in the range of about 1.5 µm to about 5 µm, but embodiments are not limited thereto.

The second semiconductor layer 32 may be disposed on a light emitting layer 36 to be described below. The second semiconductor layer 32 may be a p-type semiconductor, and as an example, in case that the light emitting element ED emits light of a blue or green wavelength band, the second semiconductor layer 32 may include a semiconductor material having a chemical formula: $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with a p-type dopant. The second semiconductor layer 32 may be doped with a p-type dopant, which includes Mg, Zn, Ca, Se, Ba, or the like, as an example. In an embodiment, the second semiconductor layer 32 may be made of p-GaN doped with p-type Mg. A length of the second semiconductor layer 32 may be in the range of about 0.05 µm to about 0.10 µm, but embodiments are not limited thereto.

It has been illustrated in FIG. 13 that each of the first semiconductor layer 31 and the second semiconductor layer 32 is configured as one layer, but embodiments are not limited thereto. According to some embodiments, each of the first semiconductor layer 31 and the second semiconductor layer 32 may further include a larger number of layers, for example, a clad layer or a tensile strain barrier reducing (TSBR) layer, according to a material of the light emitting layer 36.

The light emitting layer 36 may be disposed between the first semiconductor layer 31 and the second semiconductor layer 32. The light emitting layer 36 may include a material having a single quantum well structure or a multiple quantum well structure. In case that the light emitting layer 36 includes the material having the multiple quantum well structure, the light emitting layer 36 may have a structure in which quantum layers and well layers are alternately stacked. The light emitting layer 36 may emit light by a combination of electron-hole pairs according to electrical signals applied through the first semiconductor layer 31 and the second semiconductor layer 32. As an example, in case that the light emitting layer 36 emits light of a blue wavelength band, the light emitting layer 36 may include a material such as AlGaN or AlGaInN. For example, in case that the light emitting layer 36 has the multiple quantum well structure (e.g., the structure in which the quantum layers and the well layers are alternately stacked), the quantum layers may include a material such as AlGaN or AlGaInN, and the well layers may include a material such as GaN or AlInN. In an embodiment, the light emitting layer 36 may include AlGaInN as a material of the quantum layers and AlInN as a material of the well layers to emit blue light having a central wavelength band in the range of about 450 nm to about 495 nm.

However, embodiments are not limited thereto, and the light emitting layer 36 may have a structure in which semiconductor materials having great band gap energy and semiconductor materials having small band gap energy are alternately stacked, and may include other Group III to Group V semiconductor materials according to a wavelength band of emitted light. The light emitted by the light emitting layer 36 is not limited to light of a blue wavelength band, and in some cases, the light emitting layer 36 may also emit light of red or green wavelength bands. A length of the light emitting layer 36 may be in the range of about 0.05 µm to about 0.10 µm, but embodiments are not limited thereto.

The light emitted from the light emitting layer 36 may be emitted not only to outer surfaces of the light emitting element ED in a length direction, but also to side surfaces (e.g., opposite side surfaces) of the light emitting element ED. A direction of the light emitted from the light emitting layer 36 is not limited to a direction.

The electrode layer 37 may be an ohmic contact electrode. However, embodiments are not limited thereto, and the electrode layer 37 may also be a Schottky contact electrode. The light emitting element ED may include at least one electrode layer 37. It has been illustrated in FIG. 11 that the light emitting element ED includes an electrode layer 37, but embodiments are not limited thereto. In some cases, the light emitting element ED may include a larger number of electrode layers 37 or the electrode layer 37 may be omitted. A description of a light emitting element ED to be provided below may be equally applied even though the number of electrode layers 37 is changed or the light emitting element 30 further includes another structure.

The electrode layer 37 may reduce a resistance between the light emitting element ED and the electrodes or the contact electrodes in case that the light emitting element ED is electrically connected to the electrodes or the contact electrodes in the display device 10 according to an embodiment. The electrode layer 37 may include a metal having conductivity. The electrode layer 37 may include at least one of aluminum (Al), titanium (Ti), indium (In), gold (Au), silver (Ag), indium tin oxide (ITO), indium zinc oxide (IZO), and indium tin zinc oxide (ITZO). The electrode layer 37 may include a semiconductor material doped with an n-type dopant or a p-type dopant. However, embodiments are not limited thereto.

The insulating film 38 may surround outer surfaces of the semiconductor layers and the electrode layers. In an embodiment, the insulating film 38 may surround at least an outer surface of the light emitting layer 36, and may extend in a direction in which the light emitting element ED extends.

The insulating film 38 may function to protect these members. As an example, the insulating film 38 may surround side surface portions of these members, but may expose end portions (e.g., opposite end portions) of the light emitting element ED in the length direction.

It has been illustrated in FIG. 13 that the insulating film 38 is formed to extend in the length direction of the light emitting element ED to cover side surfaces of the first semiconductor layer 31 to the electrode layer 37, but embodiments are not limited thereto. The insulating film 38 may cover only outer surfaces of the light emitting layer 36 and some of the semiconductor layers or cover only a portion of an outer surface of the electrode layer 37, such that the outer surface of the electrode layer 37 may be partially exposed. For example, the insulating film 38 may also be formed so that an upper surface thereof may be rounded in cross section in an area adjacent to at least one end portion of the light emitting element ED.

A thickness of the insulating film 38 may be in the range of about 10 nm to about 1.0 μm, but embodiments are not limited thereto. The thickness of the insulating film 38 may be about 40 nm.

The insulating film 38 may include materials having insulating properties, such as silicon oxide ($SiO_x$), silicon nitride ($SiN_x$), silicon oxynitride ($SiO_xN_y$), and aluminum oxide ($Al_xO_y$). Accordingly, an electrical short circuit, which occurs in case that the light emitting layer 36 is in direct contact with an electrode through which an electrical signal is transferred to the light emitting element ED, may be prevented. For example, the insulating film 38 may protect an outer surface of the light emitting element ED as well as the light emitting layer 33, and may thus prevent a decrease in luminous efficiency.

For example, an outer surface of the insulating film 38 may be surface-treated. The light emitting elements ED may be jetted (or sprayed) onto and be aligned on electrodes in a state in which they are dispersed in ink. In order to maintain the light emitting elements ED in a state in which the light emitting elements ED are dispersed without being agglomerated with other adjacent light emitting elements ED in the ink, a hydrophobic or hydrophilic treatment may be performed on a surface of the insulating film 38.

A length h of the light emitting element ED may be in the range of about 1 μm to about 10 μm or about 2 μm to about 6 μm (e.g., about 3 μm to about 5 μm). For example, a diameter of the light emitting element ED may be in the range of about 30 nm to about 700 nm, and an aspect ratio of the light emitting element ED may be about 1.2 to about 100. However, embodiments are not limited thereto, and the light emitting elements ED included in the display device 10 may also have different diameters according to a difference in composition between the light emitting layers 36. For example, the diameter of the light emitting element ED may be about 500 nm.

Hereinafter, manufacturing processes of the display device 10 according to an embodiment will be described with further reference to other drawings.

FIGS. 14 to 19 are schematic cross-sectional views sequentially illustrating manufacturing processes of the display device according to an embodiment. A structure of or an arrangement relationship between members disposed at respective layers is the same as that described above, and thus, the stack order of the respective layers will be described in detail with reference to the following drawings based on cross section of FIG. 11.

Figure 14:
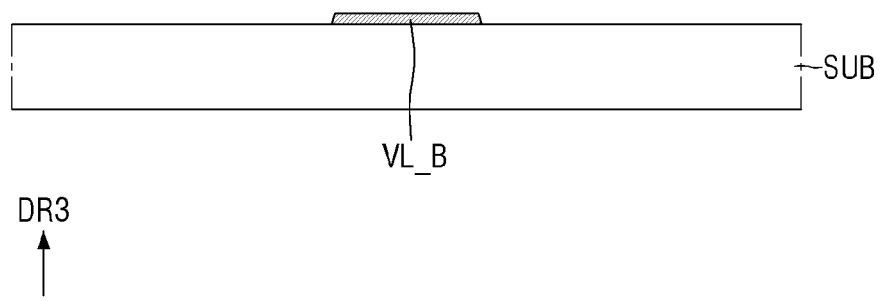
FIGS. 14 to 19 are cross-sectional views sequentially illustrating manufacturing processes of the display device according to an embodiment.

First, referring to FIG. 14, the first substrate SUB may be provided, and the first conductive layer MCL1 may be formed on the first substrate SUB. The first conductive layer MCL1 may include the first voltage line VDL, the second voltage line VSL, the lower metal layer BML, and the voltage distribution line IDL as well as the first line pattern layer VL_B. The first conductive layer MCL1 may be formed by forming a layer including a material of the first conductive layer MCL1 and patterning the layer through a process of developing and exposing the layer. Only a portion where the first line pattern layer VL_B is disposed has been illustrated in FIG. 14, but the first line pattern layer VL_B may be formed simultaneously with the first voltage line VDL, the second voltage line VSL, the voltage distribution line IDL, and the lower metal layer BML.

Figure 15:
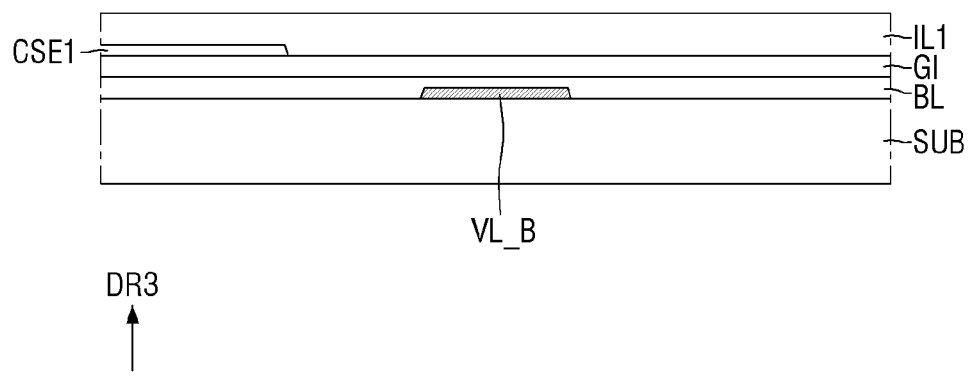
Figure 16:
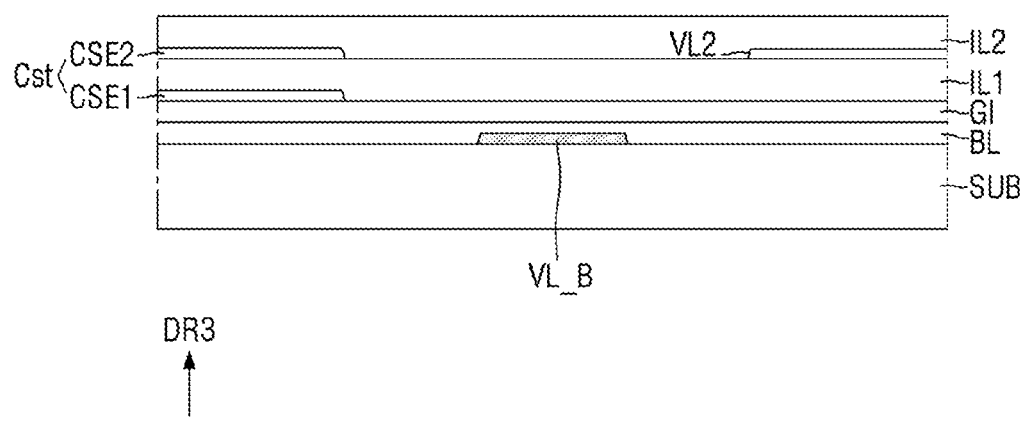

Referring to FIGS. 15 and 16, the buffer layer BL, the semiconductor layer, the first gate insulating layer GI, the second conductive layer MCL2, the first interlayer insulating layer IL1, the third conductive layer MCL3, and the second interlayer insulating layer IL2 may be stacked on the first conductive layer MCL1 to form the circuit layer. These layers may be sequentially formed in individual processes, respectively. The semiconductor layer, the second conductive layer MCL2, and the third conductive layer MCL3 among these layers may be formed by forming layers including materials of the semiconductor layer, the second conductive layer MCL2, and the third conductive layer MCL3 and patterning the layers through a process of developing and exposing the layers. A process of forming contact holes CT1 to CT11 passing through portions of the buffer layer BL, the first gate insulating layer GI, and the first interlayer insulating layer IL1 may be performed before the third conductive layer MCL3 is formed.

The second interlayer insulating layer IL2 may cover the third conductive layer MCL3, and the electrode contact holes CTD, CTS, and CTV passing through the second interlayer insulating layer IL2 to expose portions of the third conductive layer MCL3 may be formed. A process of forming the electrode contact holes CTD, CTS, and CTV may be performed as separate processes of forming the second interlayer insulating layer IL2 so as to cover both the third conductive layer MCL3 and the first interlayer insulating layer IL1 and passing through portions of the second interlayer insulating layer IL2. Since the circuit layer of the display device 10 includes the semiconductor layer in addition to the first to third conductive layers MCL1, MCL2, and MCL3, a patterning process of forming the circuit layer may be performed four times, and a process of forming contact holes passing through insulating layers may be performed two times.

However, embodiments are not limited thereto, and in some embodiments, the second interlayer insulating layer IL2 and the electrode contact holes CTD, CTS, and CTV may also be simultaneously formed in one patterning process through a half-tone mask or a slit mask. For example, a process of forming the electrode contact holes CTD, CTS, and CTV and a process of forming the second interlayer insulating layer IL2 may be simultaneously performed, and accordingly, the number of processes of forming contact holes among the manufacturing processes of the display device 10 may be decreased once.

Figure 17:
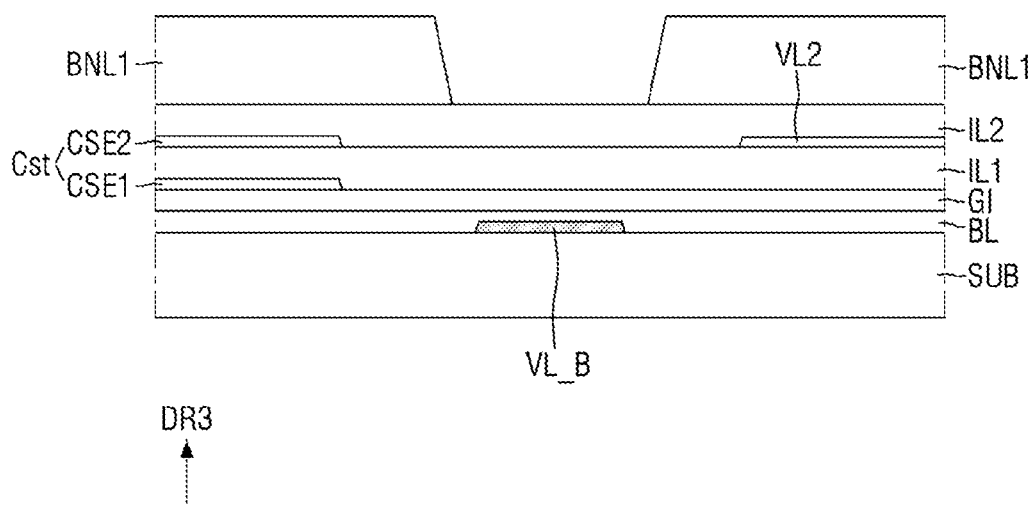

Referring to FIG. 17, the first banks BNL1 may be formed on the second interlayer insulating layer IL2. The first banks BNL1 may be formed through a process of stacking an organic insulating material layer including an organic insulating material, forming a photoresist on the organic insulating material layer, and exposing and developing the organic insulating material layer. The first banks BNL1 may be formed to expose a portion of an upper surface of the second interlayer insulating layer IL2. In an area in which the second interlayer insulating layer IL2 is exposed, the electrodes RME1 and RME2 may be disposed or the second bank BNL2 may be disposed.

Figure 18:
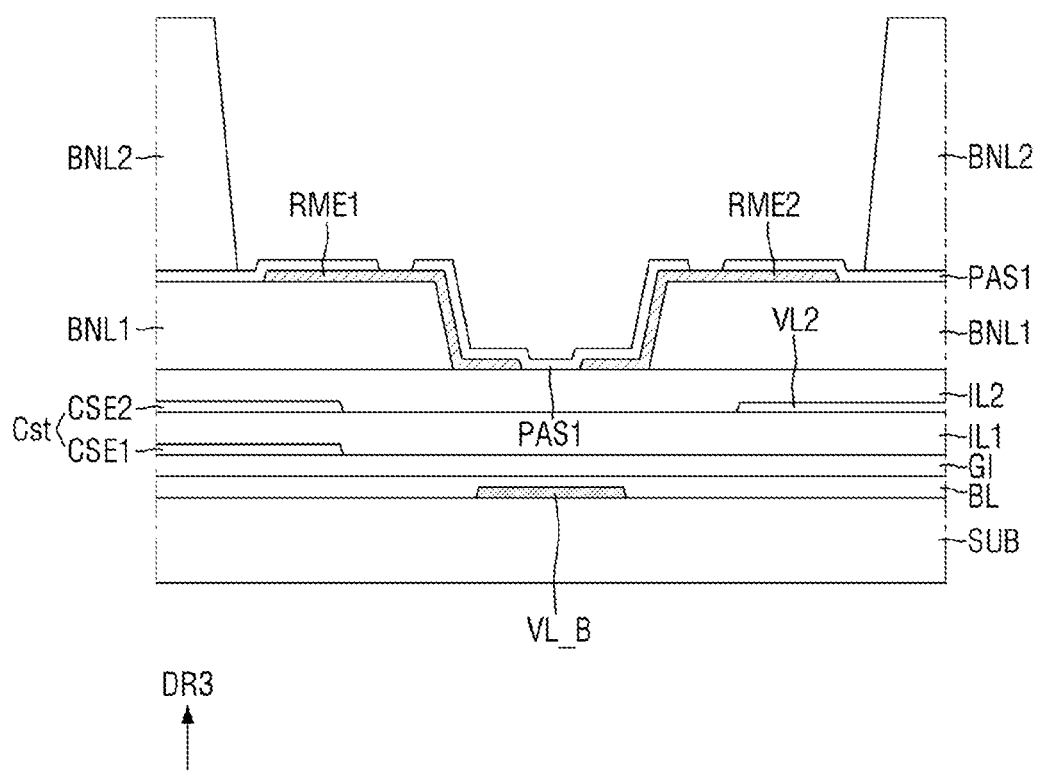

Referring to FIG. 18, the electrodes RME1 and RME2, the first insulating layer PAS1, and the second bank BNL2 may be formed on the first banks BNL1. The electrodes RME1 and RME2 may be formed in substantially the same manner as the process of forming the first to third conductive layers MCL1, MCL2, and MCL3 described above. The electrodes RME1 and RME2 may be formed by a process of forming a layer including a material of the electrodes RME1 and RME2 on the first banks BNL1 and patterning the layer.

After the first insulating layer PAS1 is formed to cover the electrodes RME1 and RME2 and the first banks BNL1, a process of forming openings exposing portions of upper surfaces of the electrodes RME1 and RME2 in the first insulating layer PAS1 may be performed. This process may be performed in the same manner as the process of forming the contact holes CT1 to CT11 of the circuit layer. The second bank BNL2 may be formed in substantially the same manner as the first banks BNL1.

Figure 19:
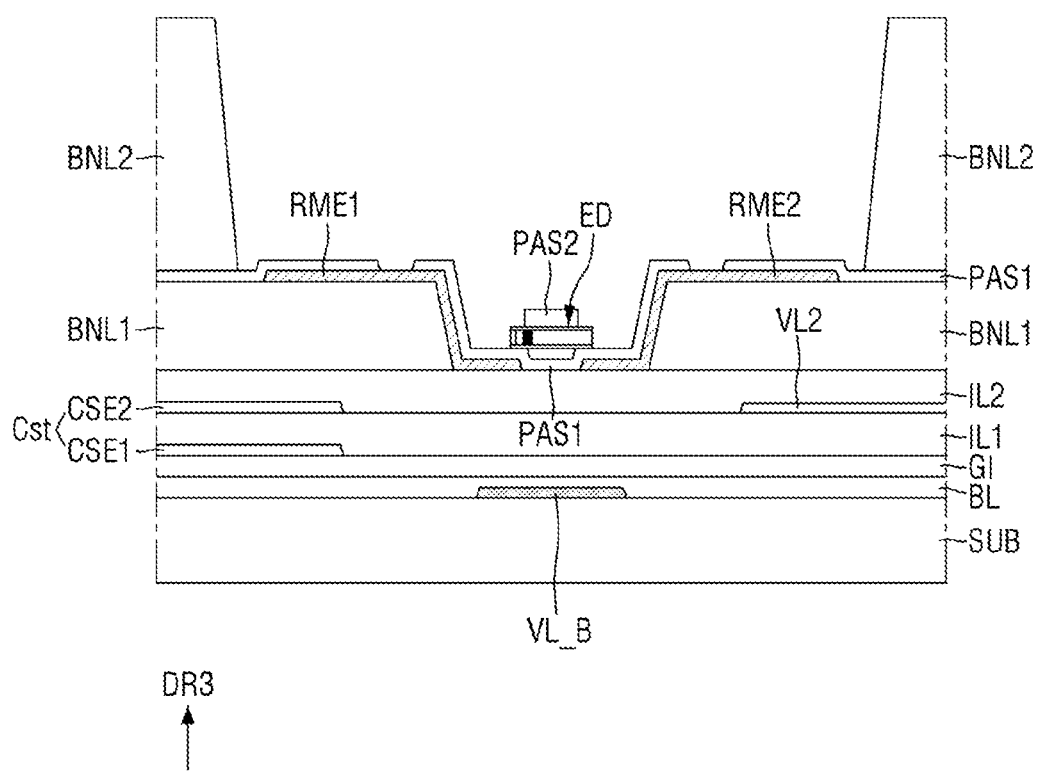

Referring to FIG. 19, the light emitting elements ED may be disposed on the first insulating layer PAS1, and the second insulating layer PAS2 may be formed. In an embodiment, the light emitting elements ED may be prepared in a state in which they are dispersed in ink, and may be jetted (or sprayed) onto the emission area EMA through an inkjet printing process. The second bank BNL2 may prevent the ink from overflowing into the emission areas EMA of other adjacent sub-pixels PXn. In case that the ink is jetted (or sprayed) onto the emission area EMA, alignment signals may be applied to the respective electrodes RME1 and RME2 to generate an electric field on the electrodes RME1 and RME2. The light emitting elements ED dispersed in the ink receive a dielectrophoretic force by the electric field, such that end portions (e.g., opposite end portions) of the light emitting elements ED may be disposed on different electrodes RME1 and RME2 in case that positions and alignment directions of the light emitting elements ED are changed.

In case that the light emitting elements ED are disposed, the second insulating layer PAS2 fixing the light emitting elements ED may be formed. The second insulating layer PAS2 may be formed by a process of forming a layer including an insulating material so as to cover the first insulating layer PAS1 and the light emitting elements ED in the emission area EMA and removing the layer so that end portions (e.g., opposite end portions) of the light emitting elements ED may be exposed. Also in a process of forming the second insulating layer PAS2, a patterning process may be performed once.

For example, the contact electrodes CNE1 and CNE2 may be formed on the second insulating layer PAS2 and the light emitting elements ED to manufacture the display device 10. The contact electrodes CNE1 and CNE2 may also be formed by forming a layer including a material of the contact electrodes and by performing a patterning process of exposing and developing the layer, similar to the electrodes RME1 and RME2. Through the above processes, the display device 10 including the circuit layer and the display element layer may be manufactured.

The display device 10 may be manufactured by performing a patterning process of forming the first banks BNL1, the first insulating layer PAS1, the electrodes RME1 and RME2, the second bank BNL2, the second insulating layer PAS2, and the contact electrodes CNE1 and CNE2 six times as a process of forming the display element layer disposed on the circuit layer. Since the circuit layer of the display device 10 may be formed by performing the patterning process four times and performing the process of forming contact holes two times, the display device 10 according to an embodiment may be manufactured by performing the patterning process a total of twelve times.

However, embodiments are not limited thereto, and some layers may be omitted or be formed in the same process as other layers, such that the number of manufacturing processes of the display device 10 may be further decreased. Hereinafter, other embodiments of the display device 10 will be described with reference to other drawings.

Figure 20:
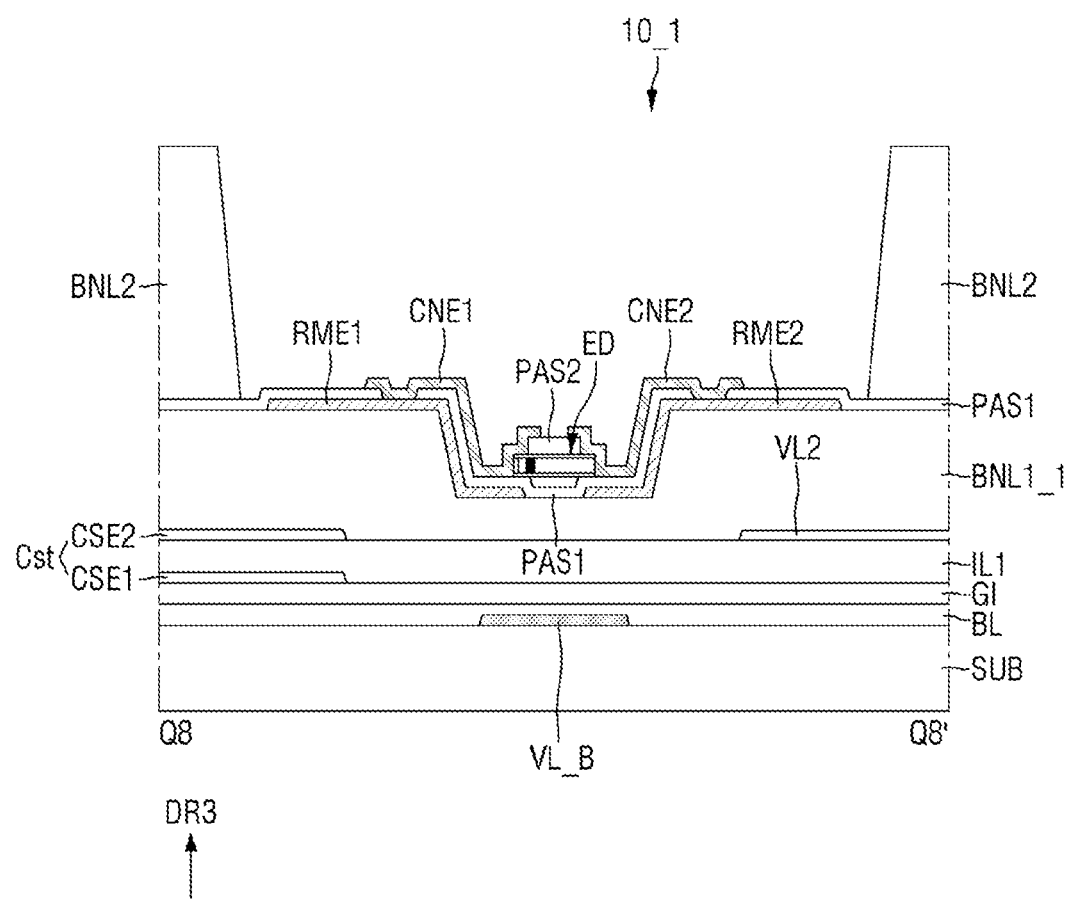
FIG. 20 is a schematic cross-sectional view illustrating a partial cross-section of a display device according to an embodiment.

FIG. 20 is a schematic cross-sectional view illustrating a partial cross-section of a display device according to an embodiment.

Referring to FIG. 20, in a display device 10_1 according to an embodiment, the second interlayer insulating layer IL2 and a first bank BNL1_1 may be formed to be integral with each other. In the display device 10_1, a process of forming the second interlayer insulating layer IL2 may be replaced with a process of forming the first bank BNL1_1. The first bank BNL1_1 may be disposed (e.g., directly disposed) on the third conductive layer MCL3 and the first interlayer insulating layer IL1. The embodiment is different from an embodiment of FIG. 11 in that the second interlayer insulating layer IL2 is integral with the first bank BNL1_1.

As the process of forming the first bank BNL1_1, a process of forming a layer including an organic insulating material on the third conductive layer MCL3 and the first interlayer insulating layer IL1 and partially patterning the layer may be performed. The first bank BNL1_1 may be patterned so that a portion thereof in the emission area EMA may have a small height, and the first bank BNL1_1 of the corresponding area may be formed so that side surfaces thereof may be inclined. A portion of the first bank BNL1_1 may be recessed to have a small height, and the light emitting elements ED may be disposed in the recessed portion of the first bank BNL1_1. For example, in the process of forming the first bank BNL1_1, the electrode contact holes CTD, CTS, and CTV may be formed simultaneously with forming a portion where the light emitting elements ED are disposed. The first bank BNL1_1 may be formed by forming a layer including an organic insulating material and patterning the layer or may be formed in one process through a half-tone mask or a slit mask.

In an embodiment, the second interlayer insulating layer IL2 and the first bank BNL1_1 may be integral with each other, and accordingly, the number of manufacturing processes of the display device 10_1 may be decreased once, such that the display device 10_1 may be manufactured by performing the patterning process a total of eleven times.

Figure 21:
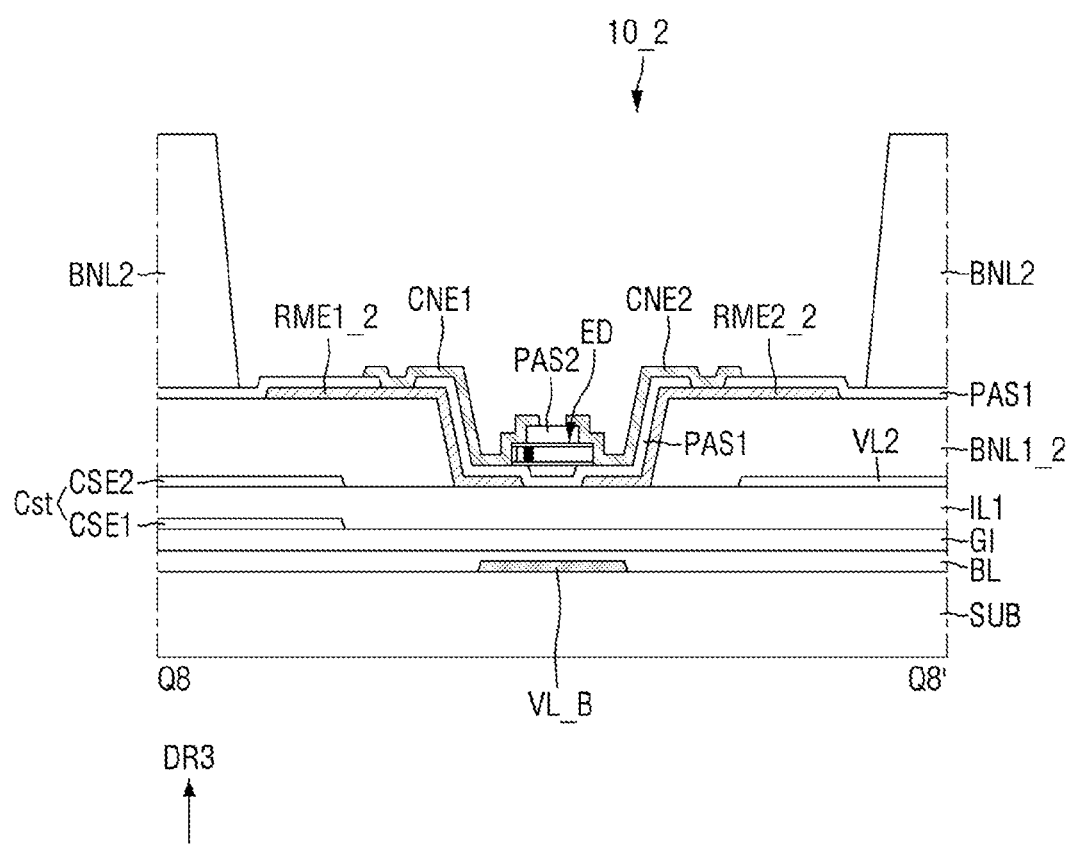
FIG. 21 is a schematic cross-sectional view illustrating a partial cross-section of a display device according to an embodiment.

FIG. 21 is a schematic cross-sectional view illustrating a partial cross-section of a display device according to an embodiment.

Referring to FIG. 21, in a display device 10_2 according to an embodiment, the second interlayer insulating layer IL2 may be omitted, such that a first bank BNL1_2 may be disposed (e.g., directly disposed) on the third conductive layer MCL3 and the first interlayer insulating layer IL1, but may be disposed so as to expose a portion of an upper surface of the first interlayer insulating layer IL1, Electrodes RME1_2 and RME2_2 and the first insulating layer PAS1 may be disposed (e.g., directly disposed) on the exposed first interlayer insulating layer IL1, and the light emitting elements ED may be disposed on the electrodes RME1_2 and RME2_2 and the first insulating layer PAS1. The embodiment is different from the above-described embodiment in that the second interlayer insulating layer IL2 is omitted, such that the first bank BNL1_2 may be disposed (e.g., directly disposed) on the first interlayer insulating layer IL1.

Unlike an embodiment of FIG. 20, a layer integral with the first bank BNL1_2 may not be disposed in an area in which the light emitting elements ED are disposed, and a first electrode RME1_2 and a second electrode RME2_2 and the first insulating layer PAS1 may be disposed (e.g., directly disposed) on the first interlayer insulating layer IL1. For example, lines of the third conductive layer MCL3 may not be disposed in the area in which the light emitting elements ED are disposed, and the first line pattern layer VL_B of the third voltage line VL1 may overlap the light emitting elements ED in the thickness direction. Even though the second interlayer insulating layer IL2 is omitted, the electrodes RME1_2 and RME2_2 and the first insulating layer PAS1 may be disposed (e.g., directly disposed) on the first interlayer insulating layer IL1 and may be separated from the lines of the third conductive layer MCL3. A height of the first bank BNL1_2 may decrease, and accordingly, a thickness of the display device 10_2 may further decrease.

Figure 22:
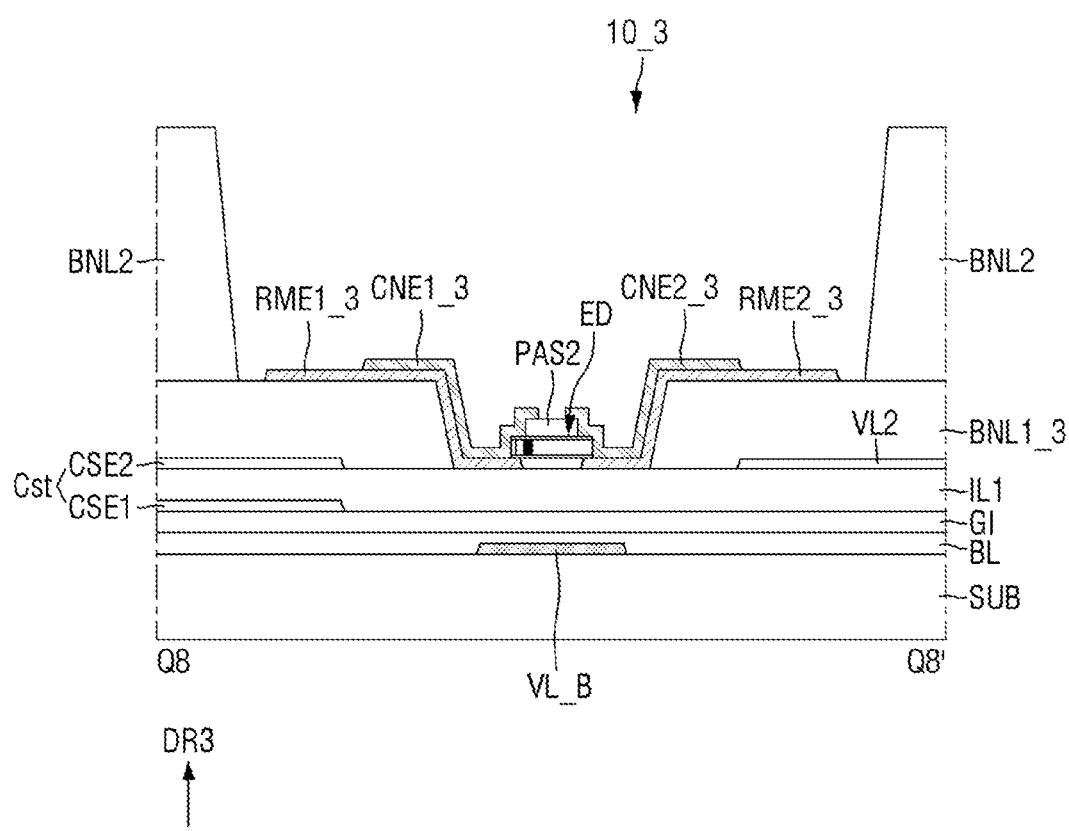
FIG. 22 is a schematic cross-sectional view illustrating a partial cross-section of a display device according to an embodiment.

FIG. 22 is a schematic cross-sectional view illustrating a partial cross-section of a display device according to an embodiment.

Referring to FIG. 22, in a display device 10_3 according to an embodiment, the first insulating layer PAS1 may be omitted, and the light emitting elements ED may be disposed (e.g., directly disposed) on a first electrode RME1_3 and a second electrode RME2_3. A first contact electrode CNE1_3 and a second contact electrode CNE2_3 may be in contact with the respective electrodes RME1_3 and RME2_3 also on inclined side surfaces of first banks BNL1_3 as the first insulating layer PAS1 is disposed. The embodiment is different from an embodiment of FIG. 21 in that the first insulating layer PAS1 is omitted. Since the first insulating layer PAS1 is also omitted in addition to the second interlayer insulating layer IL2, the number of manufacturing processes of the display device 10_3 may be decreased once, such that the display device 10_3 may be manufactured by performing the patterning process a total of ten times. Hereinafter, an overlapping description will be omitted.

Figure 23:
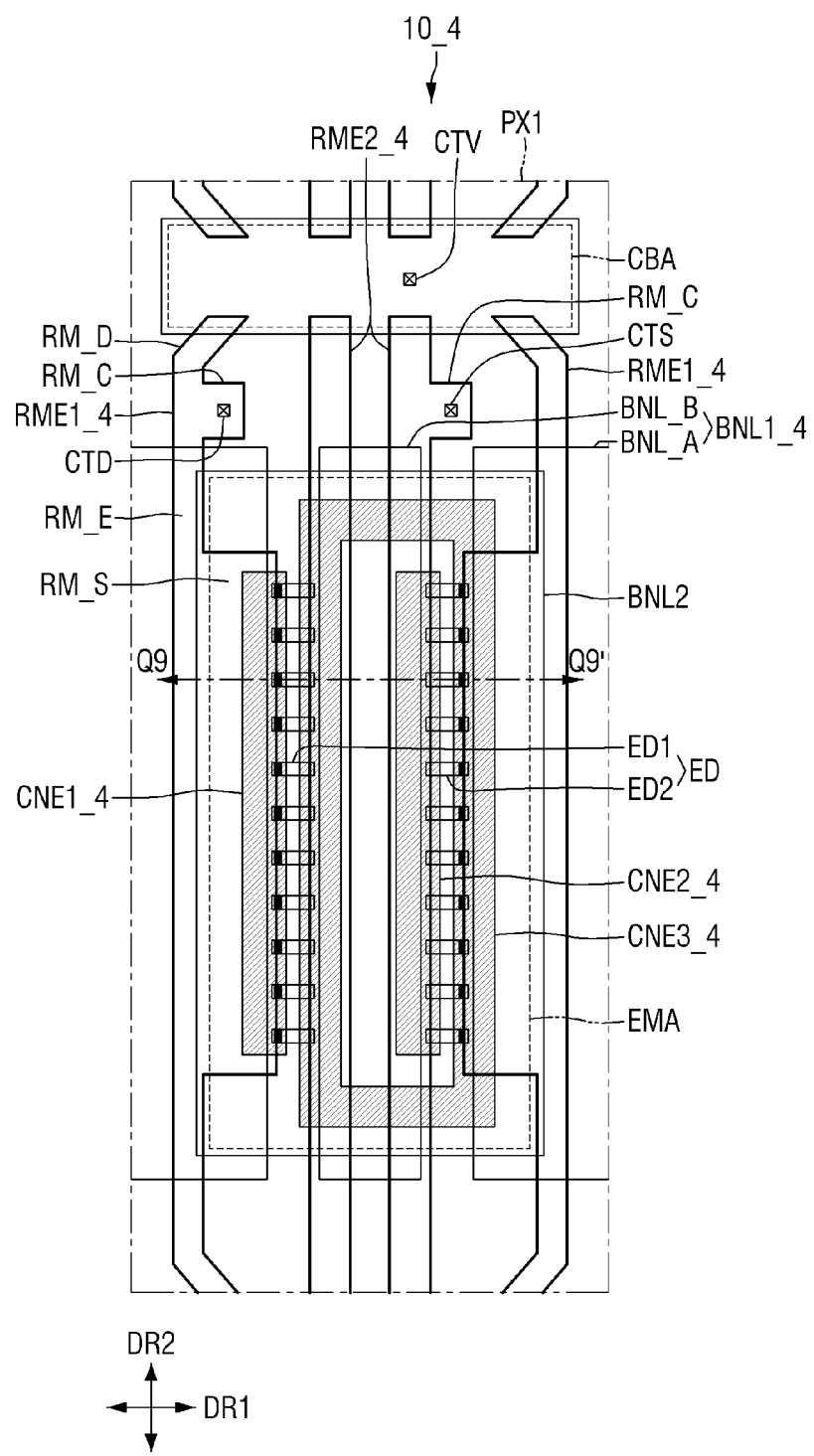
FIG. 23 is a schematic plan view illustrating a sub-pixel of a display device according to an embodiment.
Figure 24:
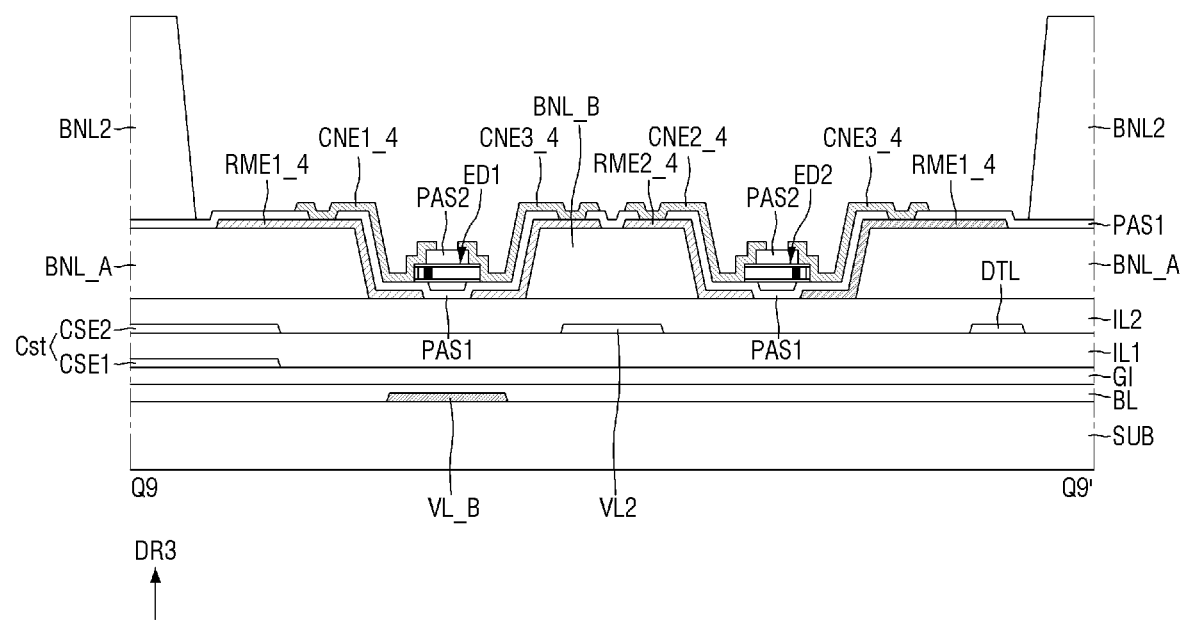
FIG. 24 is a schematic cross-sectional view taken along line Q9-Q9' of FIG. 23.

FIG. 23 is a schematic plan view illustrating a sub-pixel of a display device according to an embodiment. FIG. 24 is a schematic cross-sectional view taken along line Q9-Q9' of FIG. 23.

Referring to FIGS. 23 and 24, a display device 10_4 according to an embodiment may include larger numbers of electrodes RME1_4 and RME2_4 and contact electrodes CNE1_4, CNE2_4 and CNE3_4. Each sub-pixel PXn may include two first electrodes RME1_4 and two second electrodes RME2_4, and accordingly, may include light emitting elements ED1 and ED2 arranged at different positions. The embodiment is different from an embodiment of FIG. 11 in the numbers and structures of electrodes RME1_4 and RME2_4 disposed in each sub-pixel PXn and an arrangement of the contact electrodes CNE1_4, CNE2_4 and CNE3_4. Hereinafter, an overlapping description will be omitted, and contents different from those described above will be described.

A first bank BNL1_4 may include first sub-banks BNL_A and a second sub-bank BNL_B having different widths. The first sub-banks BNL_A may have substantially the same shape as those of the display devices 10 according to other embodiments, and the second sub-bank BNL_B may be disposed between the first sub-banks BNL_A. The second sub-bank BNL_B may extend in the second direction DR2 at a central portion of the emission area EMA of the sub-pixel PXn. The second sub-bank BNL_B may have a smaller width than the first sub-banks BNL_A and may be spaced apart from the first sub-banks BNL_A between the first sub-banks BNL_A.

The first electrodes RME1_4 may be disposed on the first sub-banks BNL_A, and may extend in the second direction DR2. The first electrode RME1_4 may include an expansion part RM_S extending in the second direction DR2 and having a greater width than other portions, bent parts RM_D extending in a direction inclined from the first and second directions DR1 and DR2, and extension parts RM_E connecting the bent parts RM_D and the expansion part RM_S to each other. The first electrode RME1_4 may have a shape in which it extends in the second direction DR2, but may partially have a shape in which it has a greater width or is bent in a direction inclined from the second direction DR2. The first electrodes RME1_4 disposed in each sub-pixel PXn may have a symmetrical structure with respect to a central portion of the emission area EMA, and second electrodes RME2_4 may be spaced apart from the first electrodes RME1_4 between the first electrodes RME1_4.

The expansion part RM_S of the first electrode RME1_4 may have a greater width than other portions. The expansion parts RM_S may be disposed on the first sub-banks BNL_A within the emission area EMA of the sub-pixel PXn, may extend in the second direction DR2, and may be spaced apart from the second electrodes RME2_4. The first electrode RME1_4 may include the expansion part RM_S and may be disposed more adjacent to the second electrode RME2_4 in the expansion part RM_S than other portions, and the light emitting elements ED may be disposed on the second electrode RME2_4 and the expansion part RM_S of the first electrode RME1_4.

The extension parts RM_E may be connected (e.g., electrically connected) to sides (e.g., opposite sides) of the expansion part RM_S in the second direction DR2, respectively. The extension parts RM_E may be connected (e.g., electrically connected) to the expansion part RM_S and be disposed across the emission area EMA of each sub-pixel PXn and the second bank BNL2. The extension part RM_E may have a width smaller than that of the expansion part RM_S. Sides of the respective extension parts RM_E extending in the second direction DR2 may be connected (e.g., electrically connected) to a side of the expansion part RM_S extending in the second direction DR2 on the same line. For example, sides of the expansion part RM_S and the extension parts RM_E at an outer side with respect to the center portion of the emission area EMA, of sides (e.g., opposite sides) of the expansion part RM_S and the extension parts RM_E may be extended and connected to each other.

A contact part RM_C having a relatively great width may be formed in the extension part RM_E disposed on the upper side of the emission area EMA. The contact part RM_C overlaps the second bank BNL2, such that a first electrode contact hole CTD may be formed. However, the contact part RM_C may be formed in only any one of the first electrodes RME1_4 disposed in each sub-pixel PXn, and may not be formed in another one of the first electrodes RME1_4.

The bent parts RM_D may be connected (e.g., electrically connected) to the extension parts RM_E. The bent part RM_D may be connected (e.g., electrically connected) to the extension part RM_E on the upper side of the emission area EMA and disposed across the second bank BNL2 and the sub-area CBA or may be disposed on the lower side of the emission area EMA and disposed across a boundary area with a sub-pixel PXn adjacent in the second direction DR2. The bent parts RM_D may be bent toward the direction inclined from the second direction DR2, for example, the center portion of the sub-pixel PXn.

The second electrodes RME2_4 may have a shape similar to that of an embodiment of FIG. 7, and second electrodes RME2_4, for example, two second electrodes RME2_4 may be disposed between the first electrodes RME1_4. The second electrodes RME2_4 may be disposed on sides (e.g., opposite sides) of the second sub-bank BNL_B in the first direction DR1 and spaced apart from each other. The second electrode RME2_4 disposed on the right side, which is any one of the second electrodes RME2_4, may have a contact part RM_C formed at a portion overlapping the second bank BNL2, and the contact part RM_C may be connected (e.g., electrically connected) to the fourth voltage line VL2 through a second electrode contact hole CTS.

An interval (or distance) between the first electrode RME1_4 and the second electrode RME2_4 may change according to portions of the first electrode RME1_4. For example, an interval (or distance) between the expansion part RM_S and the second electrode RME2_4 may be smaller than an interval between the extension part RM_E and the bent part RM_D. However, embodiments are not limited thereto.

End portions (e.g., opposite end portions) of the light emitting elements ED may be disposed on the expansion part RM_S of the first electrode RME1_4 and the second electrode RME2_4. End portions of the light emitting elements ED at which the second semiconductor layers 32 are disposed, of end portions (e.g., opposite end portions) of the light emitting element ED may be disposed on the first electrode RME1_4, respectively. Accordingly, the light emitting elements ED may include first light emitting elements ED1 between the electrodes RME1_4 and RME2_4 disposed on the left side of the center portion of the sub-pixel PXn and second light emitting elements ED2 between the electrodes RME1_4 and RME2_4 disposed on the right side of the center portion of the sub-pixel PXn. In each sub-pixel PXn, directions to which end portions of the first light emitting elements ED1 and the second light emitting elements ED2 are directed may be opposite to each other.

The display device 10 may include a larger number of electrodes RME1_4 and RME2_4, and accordingly, may include a larger number of contact electrodes CNE1_4, CNE2_4 and CNE3_4.

In an embodiment, the contact electrodes CNE1_4, CNE2_4, and CNE3_4 may include a first contact electrode CNE1_4 disposed on any one of the first electrodes RME1_4, a second contact electrode CNE2_4 disposed on any one of the second electrodes RME2_4, and a third contact electrode CNE3_4 disposed on another one of the first electrodes RME1_4 and another one of the second electrodes RME2_4 and surrounding the second contact electrode CNE2_4.

The first contact electrode CNE1_4 may be disposed on any one of the first electrodes RME1_4. For example, the first contact electrode CNE1_4 may be disposed on the expansion part RM_S of the first electrode RME1_4 on which end portions of the first light emitting elements ED1 are disposed. The first contact electrode CNE1_4 may be in contact with each of the expansion part RM_S of the first electrode RME1_4 and end portions of the first light emitting elements ED1. The second contact electrode CNE2_4 may be disposed on any one of the second electrodes RME2_4. For example, the second contact electrode CNE2_4 may be disposed on the second electrode RME2_4 on which the other end portions of the second light emitting element ED2 are disposed. The second contact electrode CNE2_4 may be in contact with each of the second electrode RME2_4 and the other end portions of the second light emitting elements ED2. The first contact electrode CNE1_4 and the second contact electrode CNE2_4 may be in contact with the electrodes RME1_4 and RME2_4 in which the first electrode contact hole CTD and the second electrode contact hole CTS are formed, respectively. The first contact electrode CNE1_4 may be in contact with the first electrode RME1_4 electrically connected to the first transistor T1 through the first electrode contact hole CTD, and the second contact electrode CNE2_4 may be in contact with the second electrode RME2_4 electrically connected to the second voltage line VSL through the second electrode contact hole CTS. The first contact electrode CNE1_4 and the second contact electrode CNE2_4 may transfer electrical signals applied from the first transistor T1 or the second voltage line VSL to the light emitting elements ED1 and ED2. The first contact electrode CNE1_4 and the second contact electrode CNE2_4 are substantially the same as each other as described above.

Electrodes RME1_4 and RME2_4 in which the first and second electrode contact holes CTD and CTS are not formed may be further disposed in each sub-pixel PXn. These electrodes RME1_4 and RME2_4 may be electrodes to which electrical signals are not directly applied from the first transistor T1 or the second voltage line VSL. However, the third contact electrode CNE3_4 may be disposed on the electrodes RME1_4 and RME2_4 in which the first and second contact holes CTD and CTS are not formed, and electrical signals transferred to the light emitting elements ED1 and ED2 may flow through the third contact electrodes CNE3_4.

The third contact electrode CNE3_4 may be disposed on the first electrode RME1_4 and the second electrode RME2_4 in which the first and second contact holes CTD and CTS are not formed, and may surround the second contact electrode CNE2_4. The third contact electrode CNE3_4 may surround the second contact electrode CNE2_4 by including portions extending in the second direction DR2 and a portion connecting these portions to each other and extending in the first direction DR1. The portions of the third contact electrode CNE3_4 extending in the second direction DR2 may be disposed on the first electrode RME1_4 and the second electrode RME2_4 in which the first and second contact holes CTD and CTS are not formed, respectively, to be in contact with the light emitting elements ED1 and ED2. For example, a portion of the third contact electrode CNE3_4 disposed on the second electrode RME2_4 may be in contact with the other end portions of the first light emitting elements ED1, and a portion of the third contact electrode CNE3_4 disposed on the first electrode RME1_4 may be in contact with end portions of the second light emitting elements ED2. For example, portions of the third contact electrode CNE3_4 disposed on the electrodes RME1_4 and RME2_4 in which the first and second contact holes CTD and CTS are not formed may be in contact with the electrodes RME1_4 and RME2_4 in which the first and second contact holes CTD and CTS are not formed, respectively, through openings passing through the first insulating layer PAS1. The electrodes RME1_4 and RME2_4 in which the first and second contact holes CTD and CTS are not formed may be prevented from being disposed in a floating state even though they are not connected to the third conductive layer MCL3.

A portion of the third contact electrode CNE3_4 extending in the first direction DR1 may overlap the second electrode RME2_4 in which the second electrode contact hole CTS is formed, but the first insulating layer PAS1 may be disposed between a portion of the third contact electrode CNE3_4 extending in the first direction DR1 and the second electrode RME2_4, such that a portion of the third contact electrode CNE3_4 extending in the first direction DR1 and the second electrode RME2_4 may not be directly connected to each other.

The electrical signal transferred from the first contact electrode CNE1_4 to end portions of the first light emitting elements ED1 may be transferred to the third contact electrode CNE3_4 in contact with the other end portions of the first light emitting elements ED1. The third contact electrode CNE3_4 may transfer the electrical signal to end portions of the second light emitting elements ED2, and the electrical signal may be transferred to the second electrode RME2_4 through the second contact electrode CNE2_4. Accordingly, the electrical signal for light emission of the light emitting element ED may be transferred only to a single first electrode RME1_4 and a single second electrode RME2_4, and the first light emitting elements ED1 and the second light emitting elements ED2 may be connected (e.g., electrically connected) to each other in series through the third contact electrode CNE3_4.

Figure 25:
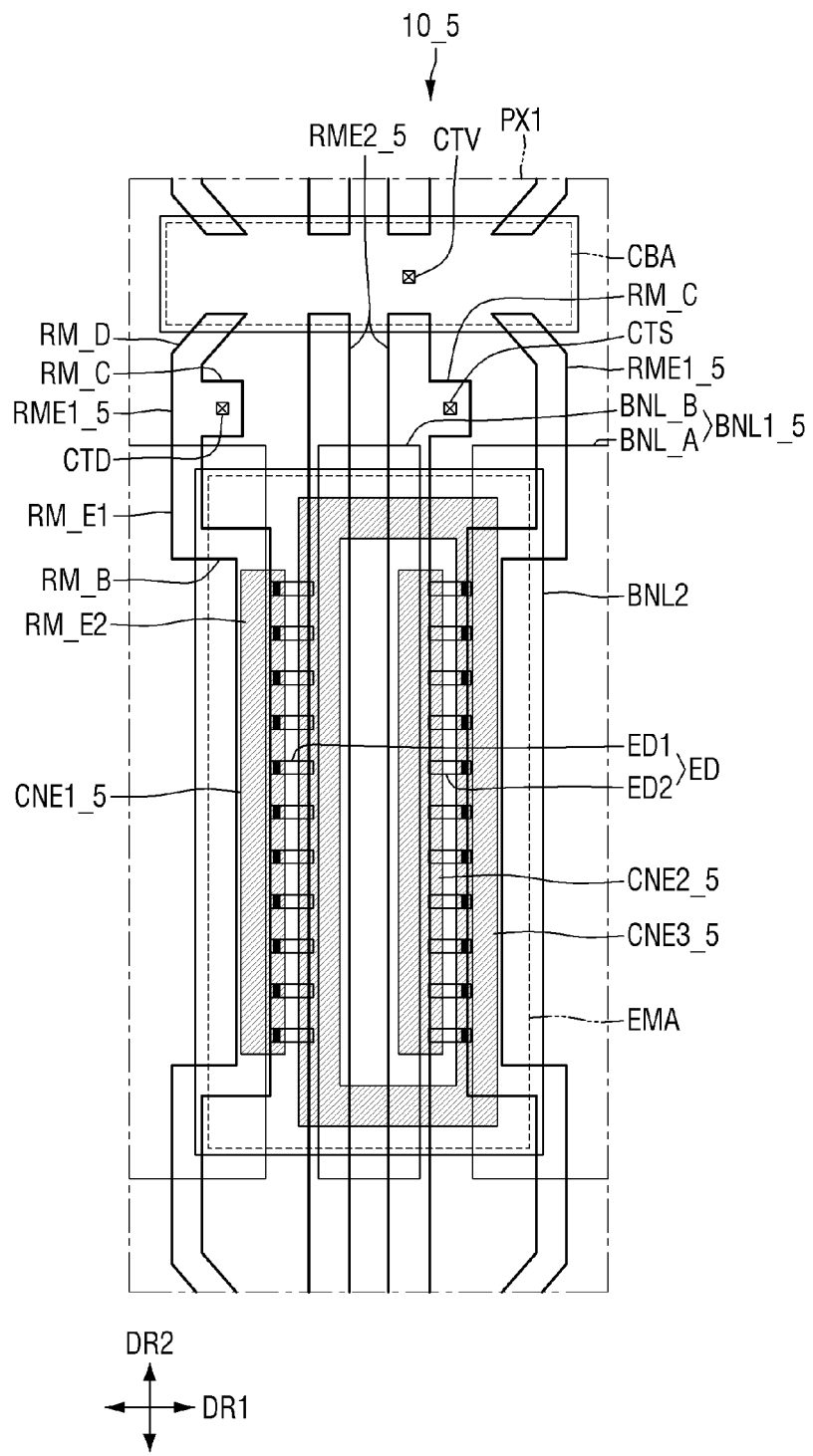
FIG. 25 is a schematic plan view illustrating a sub-pixel of a display device according to an embodiment.

FIG. 25 is a schematic plan view illustrating a sub-pixel of a display device according to an embodiment.

Referring to FIG. 25, in a display device 10_5 according to an embodiment, a first electrode RME1_5 may further include extension parts RM_E1 and RM_E2 having the same width as the other portions without the expansion part RM_S. The first electrode RME1_5 may be different from that of an embodiment of FIG. 23 in that it includes a first extension part RM_E1, a second extension part RM_E2 facing a second electrode RME2_5 and disposed on a first sub-bank BNL_A, and a connection part RM_B connecting the first extension part RM_E1 and the second extension part RM_E2 to each other. The display device 10_5 according to the embodiment is different from the display device according to an embodiment of FIG. 23 in that the first electrode RME1_5 is formed to have a uniform width without the expansion part RM_S and has a shape in which it includes extension parts RM_E1 and RM_E2 and the connection part RM_B. The first extension part RM_E1 and the second extension part RM_E2 may extend in the second direction DR2, but may not be aligned with each other and may be staggered, and the connection part RM_B may extend in the first direction DR1 and connect the first extension part RM_E1 and the second extension part RM_E2 to each other. An interval between the second electrode RME2_5 and the second extension part RM_E2 of the first electrode RME1_5 may be smaller than the second electrode RME2_5 and the other portions of the first electrode RME1_5, and the light emitting elements ED may be disposed on the second extension part RM_E2 of the first electrode RME1_5 and the second electrode RME2_5. A first bank BNL1_5, a first contact electrode CNE1_5, a second contact electrode CNE2_5, and a third contact electrode CNE3_5 may be substantially same as or similar to the first bank BNL1_4, the first contact electrode CNE1_4, the second contact electrode CNE2_4, and the third contact electrode CNE3_4 of FIG. 23, respectively. Other structures are the same as those of an embodiment of FIG. 23, and a detailed description thereof will thus be omitted.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

The invention claimed is:

1. A display device comprising:
a first substrate;
a first conductive layer including a first voltage line and a second voltage line disposed on the first substrate;
a first transistor disposed on the first conductive layer and electrically connected to the first voltage line;
a plurality of first banks disposed on the first transistor and spaced apart from each other;
a first electrode disposed on the plurality of first banks and electrically connected to the first transistor,
a second electrode disposed on the plurality of first banks and electrically connected to the second voltage line;
a plurality of light emitting elements disposed on the first electrode and the second electrode;
a first contact electrode being in contact with end portions of the light emitting elements and disposed on the first electrode; and
a second contact electrode being in contact with other end portions of the light emitting elements and disposed on the second electrode.

2. The display device of claim 1, wherein
the first electrode and the second electrode are disposed on the plurality of first banks different from each other, respectively, and are disposed to be spaced apart from each other, and
the light emitting elements are disposed between the plurality of first banks spaced apart from each other.

3. The display device of claim 2, wherein the plurality of light emitting elements are disposed on the first electrode and the second electrode.

4. The display device of claim 2, further comprising:
a first insulating layer disposed on the first electrode and the second electrode,
wherein the plurality of light emitting elements are disposed on the first insulating layer.

5. The display device of claim 4, wherein
the first contact electrode is in contact with the first electrode through an opening, the opening passing through the first insulating layer and exposing a portion of an upper surface of the first electrode, and
the second contact electrode is in contact with the second electrode through another opening, the another opening passing through the first insulating layer and exposing a portion of an upper surface of the second electrode.

6. The display device of claim 2, further comprising:
an insulating layer exposing the end portions and the other end portions of the plurality of light emitting elements and disposed on the plurality of light emitting elements, and
wherein a side of each of the first contact electrode and the second contact electrode is disposed on the insulating layer.

7. The display device of claim 1, further comprising:
a buffer layer disposed on the first conductive layer;
a semiconductor layer disposed on the buffer layer and including a first active layer of the first transistor;
a first gate insulating layer disposed on the semiconductor layer;
a second conductive layer disposed on the first gate insulating layer and including a first gate electrode of the first transistor;

a first interlayer insulating layer disposed on the second conductive layer; and
a third conductive layer disposed on the first interlayer insulating layer and including a source electrode and a drain electrode of the first transistor.

8. The display device of claim 7, further comprising:
a third voltage line including:
  a first line pattern layer; and
  a second line pattern layer being in contact with the first line pattern layer; and
a fourth voltage line, wherein
the first line pattern layer and the first conductive layer are disposed at a same level,
the second line pattern layer and the third conductive layer are disposed at a same level, and
the fourth voltage line and the third conductive layer are disposed at a same level.

9. The display device of claim 8, wherein
the second line pattern layer is in contact with the first line pattern layer through a first contact hole, the first contact hole passing through the buffer layer, the first gate insulating layer, and the first interlayer insulating layer, and
the fourth voltage line is in Street-contact with the second voltage line through a second contact hole, the second contact hole passing through the buffer layer, the first gate insulating layer, and the first interlayer insulating layer.

10. The display device of claim 9, wherein the second electrode is in contact with the fourth voltage line.

11. The display device of claim 8, further comprising:
a first conductive pattern layer,
wherein
the first conductive pattern layer and the third conductive layer are disposed at a same level, and
the first conductive pattern layer is in contact with each of the first line pattern layer and the first voltage line through contact holes, the contact holes passing through the buffer layer, the first gate insulating layer, and the first interlayer insulating layer.

12. The display device of claim 8, wherein the first line pattern layer overlaps the plurality of light emitting elements in a thickness direction.

13. The display device of claim 7, wherein the plurality of first banks are disposed on the first interlayer insulating layer.

14. The display device of claim 13, wherein at least portions of the first electrode and the second electrode are disposed on the first interlayer insulating layer.

15. The display device of claim 7, further comprising:
a second interlayer insulating layer disposed between the third conductive layer and the plurality of first banks,
wherein the second interlayer insulating layer includes silicon nitride ($SiN_x$).

16. A display device comprising:
a first voltage line and a second voltage line extending in a first direction and spaced apart from each other in a second direction intersecting the first direction;
a third voltage line and a fourth voltage line extending in the second direction, spaced apart from each other in the first direction, and crossing the first voltage line and the second voltage line, respectively;
a first electrode extending in the second direction and partially overlapping the third voltage line;
a second electrode extending in the second direction, partially overlapping the fourth voltage line, and spaced apart from the first electrode in the first direction;
a plurality of light emitting elements disposed on the first electrode and the second electrode and spaced apart from each other in the second direction;
a first contact electrode extending in the second direction, disposed on the first electrode, and being in contact with end portions of the plurality of light emitting elements, and
a second contact electrode extending in the second direction, disposed on the second electrode, and being in contact with other end portions of the plurality of light emitting elements,
wherein
the first contact electrode is electrically connected to the first voltage line, and
the second contact electrode is electrically connected to the second voltage line.

17. The display device of claim 16, wherein the first voltage line and the second voltage line are formed as a conductive layer disposed at a different level from the fourth voltage line.

18. The display device of claim 17, wherein
the third voltage line includes:
  a first line pattern layer extending in the second direction between the first voltage line and the second voltage line, and
  a second line pattern layer extending in the second direction, partially overlapping the first line pattern layer, and crossing the first voltage line and the second voltage line, and
the first line pattern layer and the second line pattern layer are connected to each other.

19. The display device of claim 17, wherein the fourth voltage line is in contact with the second voltage line at a portion crossing the second voltage line.

20. The display device of claim 16, further comprising:
a first scan line and a second scan line disposed between the first voltage line and the second voltage line and extending in the first direction, respectively; and
a data line and a fifth voltage line spaced apart from the third voltage line in the first direction and extending in the second direction.

21. The display device of claim 16, wherein
the first electrode includes an extension part and an expansion part,
the extension part extends in the second direction,
the expansion part is connected to the extension part and has a greater width than a width of the extension part, and
the plurality of light emitting elements are disposed on the expansion part.

22. The display device of claim 16, wherein
the first electrode includes a first extension part, a second extension part, and a connection part,
the first extension part and the second extension part extend in the second direction and are spaced apart from each other in the first direction,
the connection part connects the first extension part and the second extension part to each other and extends in the first direction, and
the plurality of light emitting elements are disposed on the second extension part and the second electrode.

* * * * *